United States Patent
Yoshimura et al.

(10) Patent No.: US 7,387,913 B2
(45) Date of Patent: Jun. 17, 2008

(54) 3D OPTOELECTRONIC MICRO SYSTEM

(75) Inventors: Tetsuzo Yoshimura, Machida (JP); Yukihiko Arai, Hachioji (JP)

(73) Assignees: JSR Corporation, Tokyo (JP); Tetsuzo Yoshimura, Tokyo (JP)

( * ) Notice: Subject to any disclaimer, the term of this patent is extended or adjusted under 35 U.S.C. 154(b) by 500 days.

(21) Appl. No.: 10/485,573

(22) PCT Filed: Jul. 25, 2002

(86) PCT No.: PCT/JP02/07557

§ 371 (c)(1),
(2), (4) Date: Feb. 3, 2004

(87) PCT Pub. No.: WO03/014010

PCT Pub. Date: Feb. 20, 2003

(65) Prior Publication Data

US 2004/0247236 A1 Dec. 9, 2004

(30) Foreign Application Priority Data

Aug. 8, 2001 (JP) ............... 2001-275761
Mar. 14, 2002 (JP) ............... 2002-116854

(51) Int. Cl.
*H01L 21/44* (2006.01)
*H01L 21/48* (2006.01)
*H01L 21/50* (2006.01)

(52) U.S. Cl. ............... 438/118; 438/128; 257/E23.001; 257/E21.499; 257/E33.056

(58) Field of Classification Search ............... 438/118, 438/128; 257/E23.001, E21.499, E33.056
See application file for complete search history.

(56) References Cited

U.S. PATENT DOCUMENTS

| | | | |
|---|---|---|---|
| 5,133,027 A | 7/1992 | Funazaki et al. | |
| 5,764,820 A | 6/1998 | De Dobbelaere et al. | |
| 5,917,980 A | 6/1999 | Yoshimura et al. | |
| 6,027,958 A * | 2/2000 | Vu et al. | 438/110 |
| 6,214,733 B1 * | 4/2001 | Sickmiller | 438/691 |
| 6,521,511 B1 * | 2/2003 | Inoue et al. | 438/458 |
| 6,982,184 B2 * | 1/2006 | Silverbrook | 438/51 |
| 2001/0052568 A1 * | 12/2001 | Krieg et al. | 250/239 |

FOREIGN PATENT DOCUMENTS

| | | |
|---|---|---|
| JP | A 4-181231 | 6/1992 |
| JP | A 4-204633 | 7/1992 |
| JP | A 5-346663 | 12/1993 |
| JP | A 6-151720 | 5/1994 |
| JP | A 10-321678 | 12/1998 |
| JP | A 11-121072 | 4/1999 |
| JP | A 2000-241839 | 9/2000 |
| JP | A 2001-7340 | 1/2001 |

* cited by examiner

*Primary Examiner*—Michelle Estrada
(74) *Attorney, Agent, or Firm*—Oliff & Berridge, PLC

(57) ABSTRACT

A 3D micro optical switching system (3D-MOSS) is fabricated by dividing an optical switching system into several blocks, creating optoelectronic layers where optical switches or tunable filters in each block are disposed, laminating the optoelectronic layers by connecting the layers with optical connections. The fabrication process includes a first step of selectively exposing an adhesive bond whose adhesive strength changes by exposure, a second step of contacting the selectively-exposed adhesive bond with a thin-film device array on a first substrate, and a third step of selectively ring part of thin-film devices in the thin-film device array from the first substrate onto the selectively-exposed adhesive bond in accordance with an exposure pattern.

7 Claims, 35 Drawing Sheets

ARTIFICIAL RETINA/SKIN

SYSTEM CLOTH/FILM

SYSTEM GLASSES

SYSTEM WINDOW

MATRIX VWOIC

SEARCHLIGHT VWOIC (a)

(b)

ARTIFICIAL RETINA/SKIN

SYSTEM CLOTH/FILM

SYSTEM GLASSES

SYSTEM WINDOW

3D OPTOELECTRONIC MICRO SYSTEM

TECHNICAL FIELD

The present invention relates to 3D micro optoelectronic systems with high-density integration of thin-film electronic devices and thin-film optical devices, and particularly, to 3D micro optical switching systems. The invention also relates to OE-LSI, OE-PCB, OE-MCM, smart pixels, 3D stack OE-MCM, WDM transceivers, wearable systems, sophisticated low-cost solar modules and displays.

Further, the invention relates to a process of producing micro optoelectronic systems and wearable systems with high-density integration of thin-film electronic devices and thin-film optical devices. Specifically, it is directed to a process of transferring thin-film devices using an adhesive bond whose adhesive strength changes by exposure, and a process of transferring micro devices using adhesive bonds having adhesive hierarchy.

BACKGROUND ART

The inventors of this invention have introduced S-FOLM (Scalable Film Optical Link Multi-chip-module) and its resource-saving process PL-Pack with SORT (Photolithographic Packaging with Selectively Occupied Repeated Transfer) as a low-cost and resource-saving technology for high-density integration of thin-film electronic devices and thin-film optical devices (optoelectronic system integration technology) (T. Yoshimura, J. Roman, Y. Takahashi, M. Lee, B. Chou, S. Beilin, W. Wang, and M. Inao, Proc. SPIE 3952, p. 202 (2000)).

S-FOLM is explained hereinafter, taking an optical module for optical communication as an example. In integration processes prior to the introduction of S-FOLM, bulk chips of optical devices and electronic devices have been mounted on a printed circuit board by flip-chip bonding. In S-FOLM, on the other hand, thin-film devices created on a wafer are transferred and embedded in a waveguide printed circuit board by a process such as Epitaxial Liftoff (ELO). Then, an interface film with embedded thin-film IC is deposited thereon. Such a stack architecture enables space saving. It also allows a shorter metal line length, reducing noise. Further, it achieves cost reduction with a scalability specific to a film lamination architecture. With S-FOLM, various optoelectronic systems may be implemented including a smart pixel, OE (Optoelectronic)-LSI, OE-MCM (Multi Chip Module), OE-PCB (Printed Circuit Board), and 3D system LSI.

PL-Pack with SORT has been introduced as an embedding process of thin-film devices necessary for producing S-FOLM. The process disposes thin-film devices on a substrate, embeds the thin-film devices in a polymer film, and then forms electrodes, pads, and via holes. SORT is a technique that improves the efficiency of a critical step of the thin-film device transfer and disposition process. In the integration of VCSEL (Vertical Cavity Surface Emitting Laser), for example, the first VCSEL array is created on a wafer, and, after tested, it is transferred to the first supporting substrate in a specific arrangement by the ELO process. Similarly, the second VCSEL array is transferred to the second supporting substrate. Then, a substrate with capture pads made of metal or polyimide is prepared, and the first and second supporting substrates are sequentially brought into contact thereto. The two kinds of VCSEL are thereby disposed on the substrate in a desired layout. The remaining VCSEL left on the first and second supporting substrates are disposed in a different place or a different substrate. The process thereby saves resources. For cost reduction, it saves expensive semiconductor epitaxial material, using the epitaxial material only in a site where it is necessary while using polymer in the other area. Further, with one-time processing by a semiconductor photolithography process, alignment accuracy is improved and process reduction is achieved. Furthermore, conventional mounting processes can be eliminated, permitting easy integration of different kinds of devices.

S-FOLM, however, provides no architecture of an optical switching system that is expected to form the core of the next generation optical technology. For high-speed, high-capacity communication network, a large scale optical switching system is required. A prototype of MS system for optical cross-connect with a scale as large as 1000×1000 channels has been developed using MSMS (Micro Electro Mechanical Systems). High-speed optical switching as fast as microseconds to nanoseconds, however, requires waveguide devices such as electro-optical switches and semiconductor gate switches. Creating a large-scale version of such a system has various difficulties including complex waveguide lines and a large optical circuit size. In the absence of a promising system architecture, there is a need for architectural breakthroughs.

Further, SORT has a problem that a thin-film transfer process is complicated, causing cost overrun of an entire system. It also has a problem that the thin-film transfer process requires creation of a multiple adhesive hierarchy of thin-film devices and a substrate. Thus, there is restriction that the device transfer in later stages needs higher adhesive strength. This not only narrows down the choices of materials, but also reduces process margins, destabilizing the process. Furthermore, elimination of pads is needed since they can be obstacles in system design.

Besides, S-FOLM and other technologies have provided no detail of the bonding interface of a drive IC and an optical device, particularly those with multiple fine electrodes such as Variable Well Optical IC (VWOIC) (Japanese Unexamined Patent Application Publication No. H4-181231 and H4-204633, T. Yoshimura, FUJITSU Sc. Tech. J. 27, p 115 (1991)).

An object of the present invention is to provide a high-speed optical switching system as large as 1000×1000 channels and as fast as microseconds to nanoseconds, for example, with a new architecture based on 3D micro optoelectronic system (3D-MOS).

Another object of the invention is to provide a low-cost and reliable thin-film device transfer process (which may be called "Light Assist SORT (LA-SORT)") using control of the adhesive strength of an adhesive bond by multiple stage exposure.

A further object of the invention is to provide an improved architecture of an interface between an optical switch and a drive IC, to provide a basic architecture of an all-optical 3D optoelectronic microsystem, and to provide a new architecture of a micro filter of a 3D optoelectronic microsystem.

A still further object of the invention is to provide a transfer and disposition process of micro devices called "Adhesive Hierarchy Assist SORT (AHA-SORT)" which uses a series of adhesive bonds with adhesive hierarchy, allows reuse of the adhesive bonds, and is realizable with a simple process.

Another object of the invention is to provide a system film, a system thread, a system cloth, an artificial retina, an artificial skin, a solar cell, and a display using the above.

DISCLOSURE OF THE INVENTION

These objects are achieved by a 3D micro optical switching system (3D-MOSS) including a single or a plurality of optoelectronic layers where optical switches or tunable filters are disposed, in which at least part of an optical connection is an optical connection between the optoelectronic layers.

These objects are achieved by placing in the optoelectronic layers of the 3D-MOSS at least one of a LSI, an IC, an optical switch, a tunable filter, a waveguide, a micro mirror, a micro filter, a micro lens, a micro prism, a vertical waveguide, a semiconductor laser, a photo detector, an optical memory, an optical amplifier, and a photonic crystal.

These objects are achieved by a thin-film device transferring process including a first step of selectively exposing an adhesive bond whose adhesive strength changes by light exposure, a second step of contacting the selectively-exposed adhesive bond with a thin-film device array on a first substrate, and a third step of selectively transferring part of thin-film devices in the thin-film device array from the first substrate onto the selectively-exposed adhesive bond in accordance with an exposure pattern.

These objects are achieved by embedding a thin-film device in a film or a thread.

These objects are achieved by creating a lamination structure of an optical connection having a thin film of an integrated circuit (IC) and an optoelectronic layer having a thin film of an optical device, in which a pitch of terminals at the optical connection is smaller on a side to touch the optoelectronic layer to drive.

These objects are achieved by adopting an all optical 3D optoelectronic microsystem including a first optoelectronic layer including an all-optical switch that uses light to switch light, a second optoelectronic layer for diffusing control light for driving the all-optical switch, and an optical z-connection for transferring the control light between the second optoelectronic layer and the first optoelectronic layer.

These objects are achieved by increasing a width of the waveguide in an area where a filter with a periodic dielectric structure is to be placed than in another area.

These objects are achieved by selectively creating a thin film on an adhesive bond having adhesive strength, contacting the adhesive bond with a micro device array on a substrate, and selectively transferring micro devices in accordance with the thin-film pattern on the adhesive bond.

These objects are achieved by selectively creating an irregular pattern on an adhesive bond having adhesive strength, contacting the adhesive bond with a micro device array on a substrate, and selectively transferring micro devices in accordance with the irregular pattern on the adhesive bond.

These objects are achieved by AHA-SORT creating adhesive hierarchy on adhesive bonds used in each step.

These objects are achieved by selectively creating a light-shielding layer on a light-transmission substrate, creating a peel-off layer thereon, creating a photosensitive material layer thereon, then applying light to the photosensitive material layer through the light-transmission substrate to change a property of photosensitive material to create a micro device, then removing the peel-off layer and transferring the micro device to another substrate.

These objects are achieved by embedding a micro device in a film, thread, cloth, windrow, glasses, solar cell, display, and so on by using AHA-SORT.

BEST MODES FOR CARRYING OUT THE INVENTION

Embodiment 1

Figure 1:
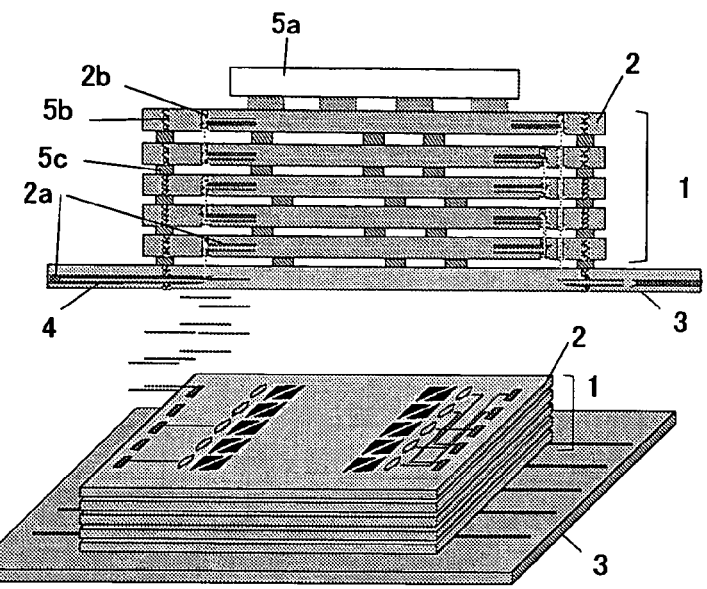
FIG. 1 shows sectional and three-dimensional schematic block diagrams of a 3D micro optical switching system (3D-MOSS) according to the first embodiment of the invention.
Figure 2:
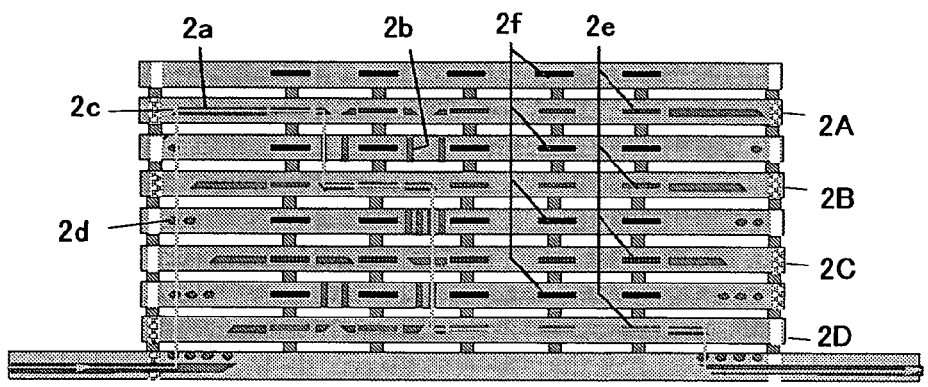
FIG. 2 shows a sectional diagram of a 3D-MOSS according to the first embodiment of the invention.
Figure 3:
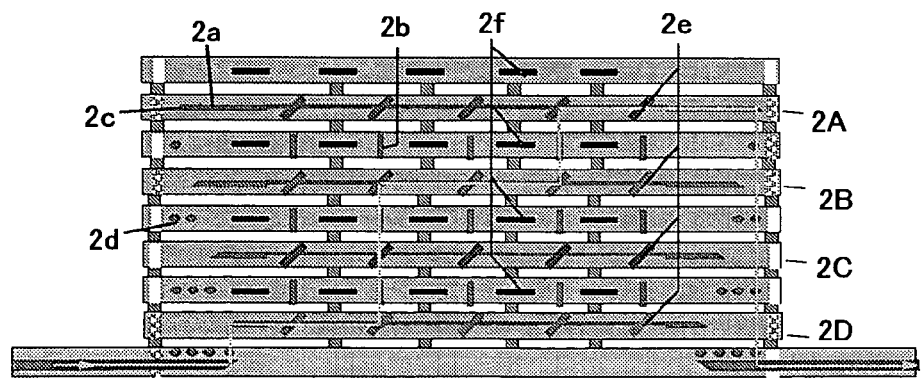
FIG. 3 shows a sectional diagram of a 3D-MOSS according to the first embodiment of the invention.

FIGS. 1, 2, and 3 show exemplary architectures of a 3D micro optical switching system (3D-MOSS) 1. The 3D-MOSS 1 comprises laminated optoelectronic layers 2 with a waveguide 2a and a thin-film optical switch 2e embedded therein. The thin-film optical switch 2e may be replaced with a thin-film tunable filter.

The layers are optically connected by a vertical waveguide 2b, a 45 degree mirror (or a micro filter) 2C, a micro lens 2d, and so on. An interlayer optical connection 5C in the 3D-MOSS 1 is referred to as an optical z-connection. In some cases, LSI/IC 5a such as a processor or a drive circuit is mounted on the top of the 3D-MOSS 1.

Reference numeral 4 in the figure designates transmitted light, and 5b designates a via hole.

A thin film of LSI/IC 2f may be embedded in each layer of the 3D-MOSS 1 as shown in FIG. 2. The thickness of a thin-film device such as LSI/IC 2f is preferably 100 µm or less, and more preferably 30 µm or less. The 3D-MOSS 1 may be mounted on an optical substrate 3. This enables communication with another 3D-moss or the outside world. FIG. 3 shows a case where the optical switch 2e (or the thin-film tunable filter) is obliquely embedded so that an optical switching function is provided in the optical z-connection part.

Figure 4:
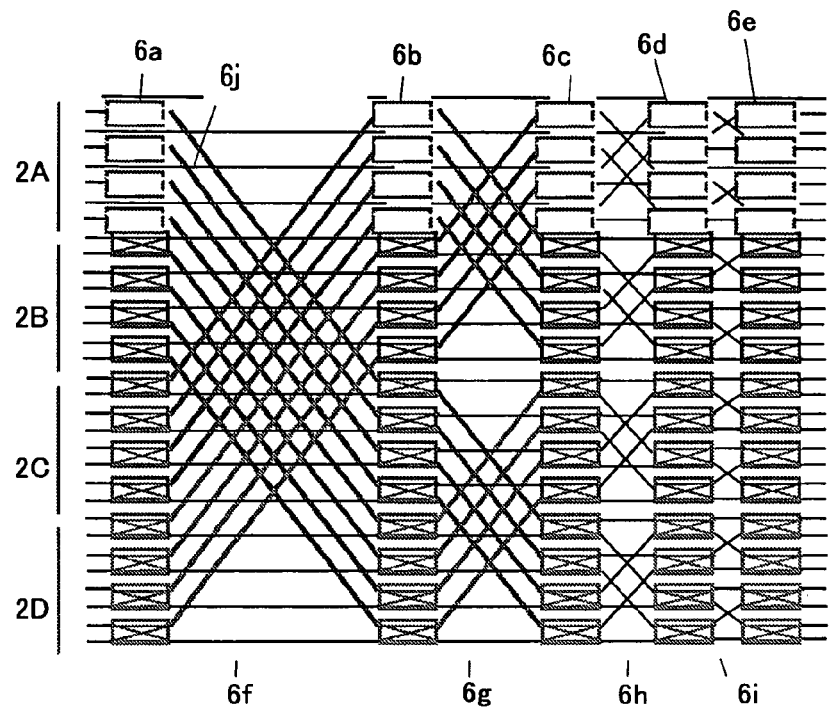
FIG. 4 shows a pattern diagram of a Banyan network.

As an example of the 3D-MOSS, 32-channel Banyan network with 2×2 optical switches is shown in FIG. 4. It includes five optical switch arrays: an array of the first optical switches 6a, an array of the second optical switches 6b, an array of the third optical switches 6c, an array of the fourth optical switches 6d, and an array of the fifth optical switches 6e. Each array has 16 pieces of 2×2 optical switches. The arrays are connected by a waveguide. In a conventional flat circuit network, a waveguide crosses another waveguide at fifteen points in the first optical connection 6f that connects the array of the first optical switches 6a and the array of the second optical switches 6b. There are seven crossing points in the second optical connection 6g, three crossing points in the third optical connection 6h, and one crossing point in the fourth optical connection 6i. Thus, the most critical connection is the first optical connection 6a with the fifteen crossing points, which is the largest number.

Figure 5:
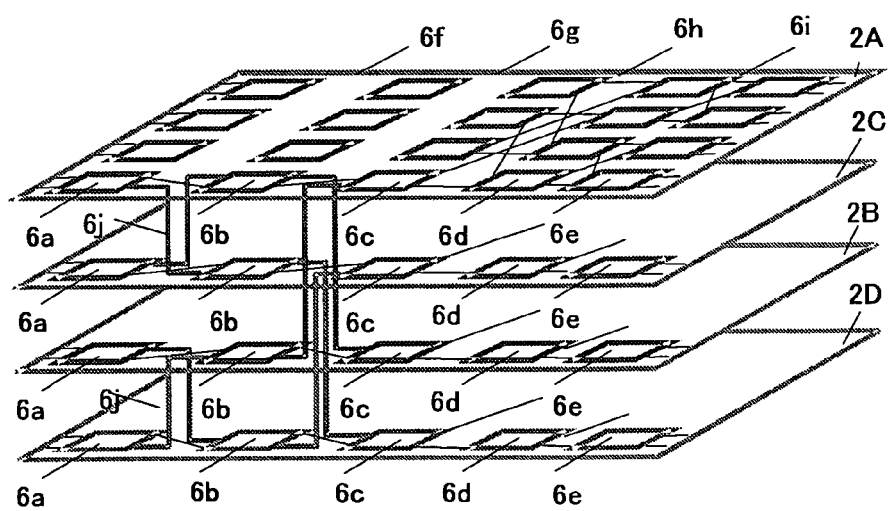
FIG. 5 shows a block diagram of the Banyan network according to the first embodiment of the invention.

The flat circuit network is now redesigned into 3D-MOSS. First, the Banyan network is divided into four blocks: block 1 (2A), block 2 (2B), block 3 (2C), and block 4 (2D), for example. The optical switches in each block are placed in a different optoelectronic layer. The optical switches 6a, 6b, 6c, 6d, and 6e in the block 1 (2A) are formed in the first optoelectronic layer. Similarly, the optical switches 6a, 6b, 6c, 6d, and 6e in the block 2 (2B) are formed in the second optoelectronic layer. Further, the optical switches 6a, 6b, 6c, 6d, and 6e in the block 3 (2C) are formed in the third optoelectronic layer. The optical switches 6a, 6b, 6c, 6d, and 6e in the block 4 (2D) are formed in the fourth optoelectronic layer. Then, the optoelectronic layers corresponding to each block are stacked in the order: the block 1 (2A), block 3 (2C), block 2 (2B), and block 4 (2D), for example, as shown in FIG. 5. The layers are connected by the optical z-connection. In this case, the first optical connection 6f connects the block 1 and 3, and the block 2 and 4, while the second optical connection 6g connects the block 1 and 2, and the block 3 and 4, each by the optical z-connection.

FIG. 5 shows only a part of the optical lines necessary for explanation to avoid complication. In this configuration, the intricate waveguides, which have been a problem of the conventional flat circuit network, can be reduced. Further, the line length can be also reduced, which is effective in closing timing gap between switching paths.

These advantages are more apparent when using more number of channels. For example, a flat optical circuit with 1024 channels has 561 crossing points of waveguides in the first optical connection. By dividing it into ten blocks and laminating them to create the 3D-MOSS architecture, the number of crossing points becomes zero, that is, it has no crossing point. Further, this architecture enables a shorter connection distance. In this example, each layer is several tens of micrometers thick, and thus ten laminated layers may be within 1 mm thick. Furthermore, it achieves a smaller system size. For example, creating 10-layer lamination allows the system width to be one-tenth of the flat optical circuit and the inter-array distance to be as short as several hundreds of micrometers. In addition, use of multichannel matrix optical switches instead of 2×2 optical switches can reduce the number of optical connections.

A network to which the 3D-MOSS according to this embodiment is applied is not restricted to the Banyan network. It is applicable to any optical switching systems comprising a plurality of optical switches and optical connections connecting them.

Examples of the optical switches include variable well optical integrated circuit (VWOIC) optical switches such as an optical deflector switch having one or more prism electrodes arranged in cascade in a slab waveguide with an electro-optical effect and an optical switch with segmented electrodes, total reflection optical switches, digital optical switches, and semiconductor gate optical switches. A microcavity tunable filter may be also used. In any cases, it is necessary to make devices in thin-film form capable of film embedding. The process will be detailed in the second embodiment.

In the 3D-MOSS laccording to this invention, it is possible to embed semiconductor lasers including VCSEL, photo detectors, optical memories, optical amplifiers composed of rare-earth doped glass waveguide and so on, and photonic crystals in addition to optical switches, tunable filters, waveguides, 45 degree micro mirrors, micro filters, micro lenses, micro prisms, and vertical waveguides.

It is also possible to employ SOLNET for the optical z-connection.

Creation of the three-dimensional architecture may employ a build-up process or a film lamination process that are used in general multilayer circuit boards. The layers may be aligned by an aligner or other devices with equivalent functions using marker and the like.

Embodiment 2

Figure 6:
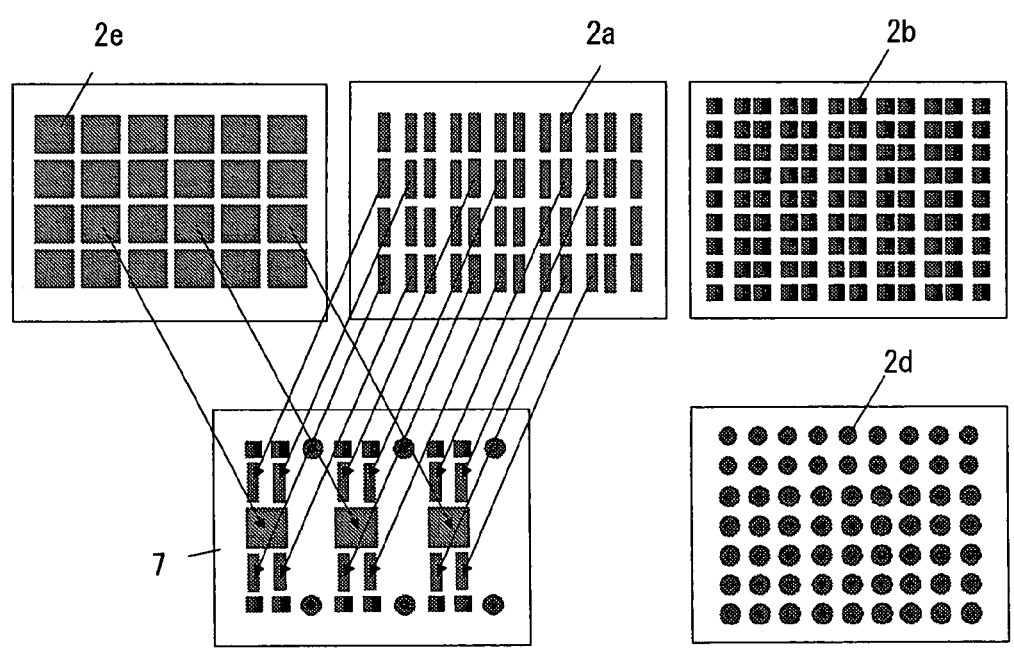
FIG. 6 is a plan view illustrating a concept of a thin-film device disposition process according to this invention.

FIG. 6 shows the concept of a thin-film device disposition process. It illustrates by an example optical switches 2e, waveguides 2a, vertical waveguides 2b, and micro lenses 2d. In the thin-film device disposition process according to the second embodiment, there is first created a high density two-dimensional array of each of the optical switches 2e, the waveguides 2a, the vertical waveguides 2b, and the micro lenses 2d. Then, part of each thin-film device array is transferred and integrated altogether to a substrate 7. The remaining thin-film devices are transferred to another substrate or another part of the same substrate. Thus, the thin-film devices are delivered from a single array to several substrate or places. Though the arrows indicating the transfer correspondence are shown only for the optical switches 2e and the waveguides 2a in FIG. 6 for simplification, the transfer of the vertical waveguides 2b and the micro lenses 2d is performed similarly. This concept works also for other thin-film devices. In this specification, a simple thin film is also treated as one kind of thin-film devices.

FIG. 7 to FIG. 11 shows a detailed process flow of "Light Assist SORT (LA-SORT)" according to the present invention. A production process is illustrated in FIG. 7 through FIG. 11 in chronological order. The detailed process flow shows a case of integrating two kinds of thin-film devices. It includes top views and cross-sectional views along line A-A'.

Figure 7:
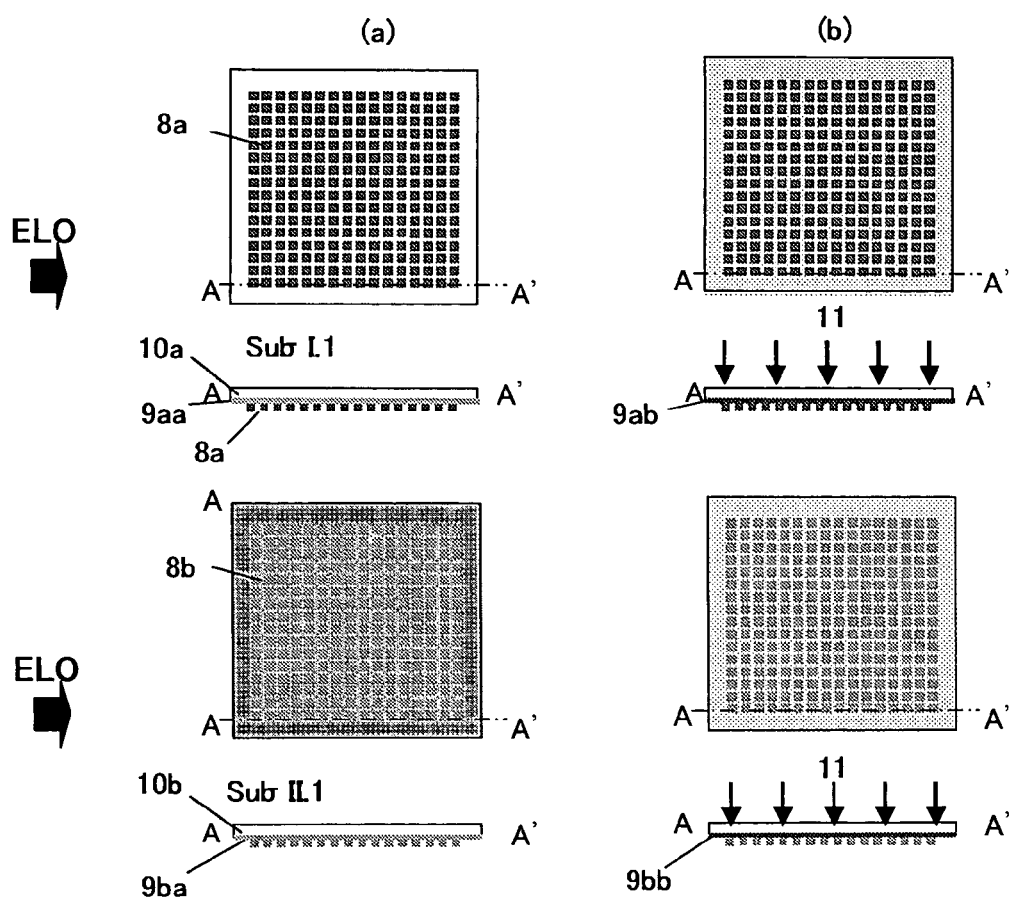
FIG. 7 shows step diagrams 1 (plan view and sectional view) illustrating a thin-film device disposition process according to the second embodiment of the invention.

First, FIG. 7 is explained hereinbelow. An array of thin-film devices I (8a) created on a wafer is transferred to a supporting substrate Sub-I. 1 (10a) having an adhesive bond 9aa by ELO or other techniques. Similarly, an array of thin-film devices II (8b) created on a wafer is transferred to a supporting substrate Sub-II. 1 (10b) with an adhesive bond 9ba by ELO or other techniques. The ELO is an easily implementable, being a standard technique for producing III-V compound semiconductor lasers, tunable filters, photo detectors, photonic crystals, and ICs. Polymer waveguides, vertical waveguides, micro lenses, and other devices on a Si wafer may be easily formed by etching away the Si. Further, rare-earth-ion-doped glass waveguide amplifiers, glass waveguides, vertical waveguides, and micro lenses may be formed by interposing an etch stop layer between Si or glass substrate and thin-film devices. They may be formed also by processing a thin-film glass sheet, a thin-film plate, or a plastic sheet. Another way to form thin-film devices is creating the above optical devices by anodic oxidation of aluminum and so on, and then removing a metal part.

Next, the backside of the supporting substrate is exposed to UV light 11 (for example, 365 nm light in the range of 600 mJ/cm$^2$). The adhesive property of the adhesive bonds 9aa and 9ba thereby change, turning into adhesive bonds 9ab and 9bb, respectively, with reduced adhesion as shown in FIG. 7b.

Meanwhile, as shown in FIG. 8c, an adhesive bond 91aa on a supporting substrate Sub-I. 2 (12a) is exposed to patterned UV light. A general photolithographic technology such as mask exposure, stepper exposure, or laser exposure may be used. The UV-exposed part turns into an adhesive bond 91ab with reduced adhesion. The intensity of the exposure in this step is preferably higher than the exposure to the backside of the supporting substrate Sub-I. 1 (10a). This prevents unwanted transfer of the thin-film devices in the following step.

Then, the supporting substrate Sub-I. 2 (12a) where the patterned UV exposure has been carried out is contact-bonded to the supporting substrate Sub-I. 1 (10a). This transfers the thin-film devices I (8a) only to the adhesive bond 91aa that is a non-UX-exposed part as shown in FIG. 8d. The remaining thin-film devices 8a are transferred to another supporting substrate or another part of the same substrate. After that, the backside of the supporting substrate Sub-I. 2 (12a) is exposed to UV light as shown in FIG. 8e. The adhesive bond 91aa located directly below the thin-film devices I (8a) thereby turns into an adhesive bond 91ab with decreased adhesion.

Next, as shown in FIG. 9f, an adhesive bond 91ba on a supporting substrate Sub-II. 2 (12b) is exposed to patterned UV light. A general photolithographic technology such as mask exposure, stepper exposure, or laser exposure may be used. The UV-exposed part turns into an adhesive bond 91bb with reduced adhesion. The intensity of the exposure in this step is preferably higher than the exposure to the backside of the supporting substrate Sub-II. 1 (10b). This prevents unwanted transfer of the thin-film devices in the following step.

Then, the supporting substrate Sub-II. 2 (12b) where the patterned UV exposure has been carried out is contact-bonded to the supporting substrate Sub-II. 1 (10b). This transfers the thin-film devices II (8b) only to the adhesive bond 91ba that is a non-UV-exposed part as shown in FIG. 9g. The remaining thin-film devices 8b are transferred to another supporting substrate or another part of the same substrate.

After that, the backside of the supporting substrate Sub-II. 2 (12b) is exposed to UV light as shown in FIG. 9h. The adhesive bond 91ba located directly below the thin-film devices II (8b) thereby turns into an adhesive bond 91bb with decreased adhesion.

Then, an adhesive bond on a substantial substrate 14 is exposed to patterned UV light as shown in FIG. 10i. The areas where the thin-film devices I (8a) and the thin-film devices II (8b) will be transferred are left unexposed. A general photolithographic technology such as mask exposure, stepper exposure, or laser exposure may be used. The intensity of the exposure in this step is preferably higher than the exposure to the backside of the supporting substrates Sub-I. 2 (12a) and Sub-II. 2 (12b). This prevents unwanted transfer of the thin-film devices form occurring in the following step.

The supporting substrate Sub-I.2 (13a) with the thin-film devices I (8a) mounted thereon is then brought into contact with the substantial substrate 14. This transfers the thin-film devices I (8a) only to the areas of the non-UV-exposed adhesive bond 9a as shown in FIG. 10j. The remaining thin-film devices I (8a) are subsequently transferred to another substrate or another part of the same substrate. With this substantial substrate, the supporting substrate Sub-II.2 (13b) with the thin-film devices II (8b) mounted thereon is brought into contact as shown in FIG. 11k. This transfers the thin-film devices II (8b) only to the non-UV-exposed areas of the substantial substrate 14 as shown in FIG. 11l. The remaining thin-film devices II (8b) are subsequently transferred to another substrate or another part of the same substrate. The process thereby achieves integration of different kinds of thin-film-devices altogether in a desired arrangement.

The backside exposure may be a front-side exposure if the thin-film devices transmit the UV light.

Embodiment 3

Figure 8:
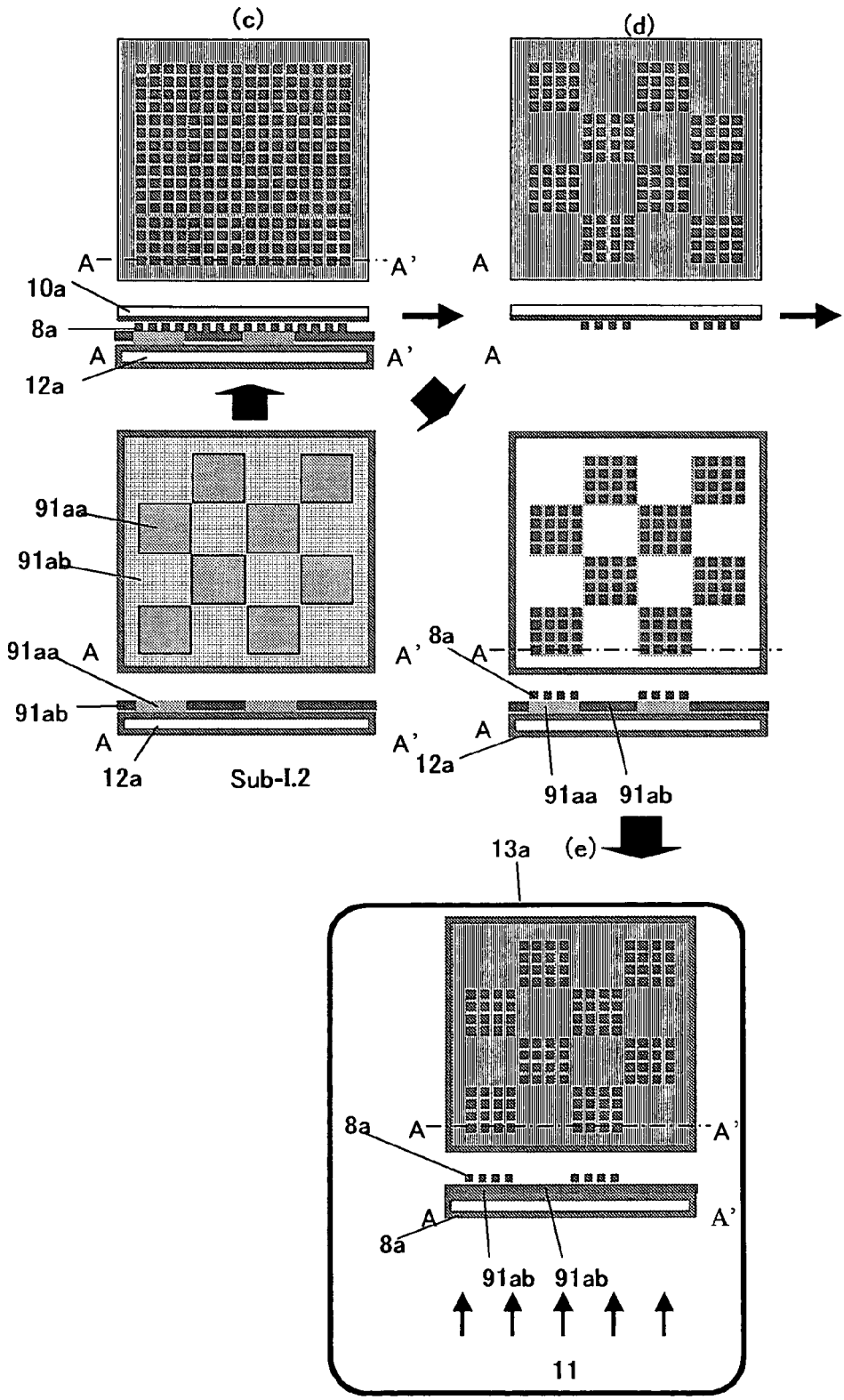
FIG. 8 shows step diagrams 2 (plan view and sectional view) illustrating the thin-film device disposition process according to the second embodiment of the invention.
Figure 9:
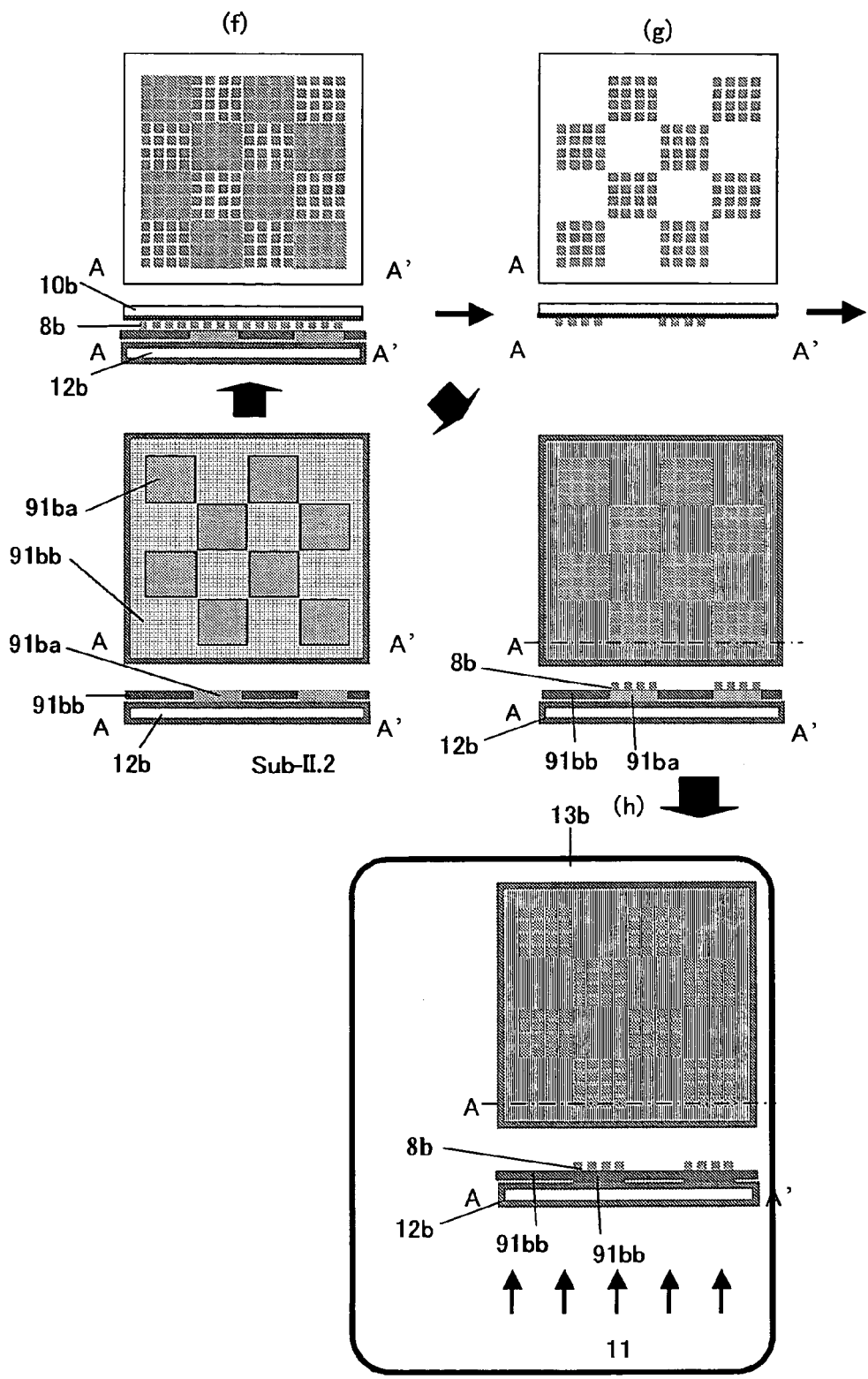
FIG. 9 shows step diagrams 3 (plan view and sectional view) illustrating the thin-film device disposition process according to the second embodiment of the invention.
Figure 10:
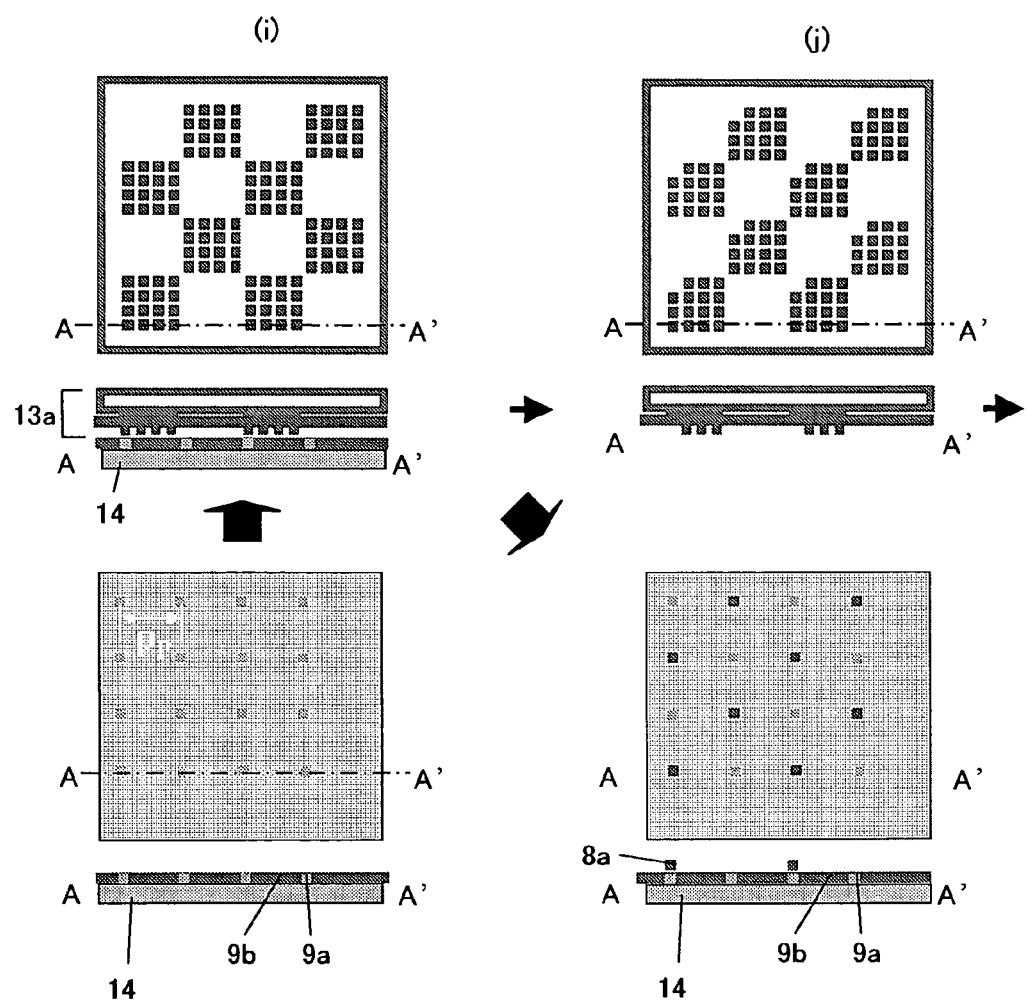
FIG. 10 shows step diagrams 4 (plan view and sectional view) illustrating the thin-film device disposition process according to the second embodiment of the invention.
Figure 11:
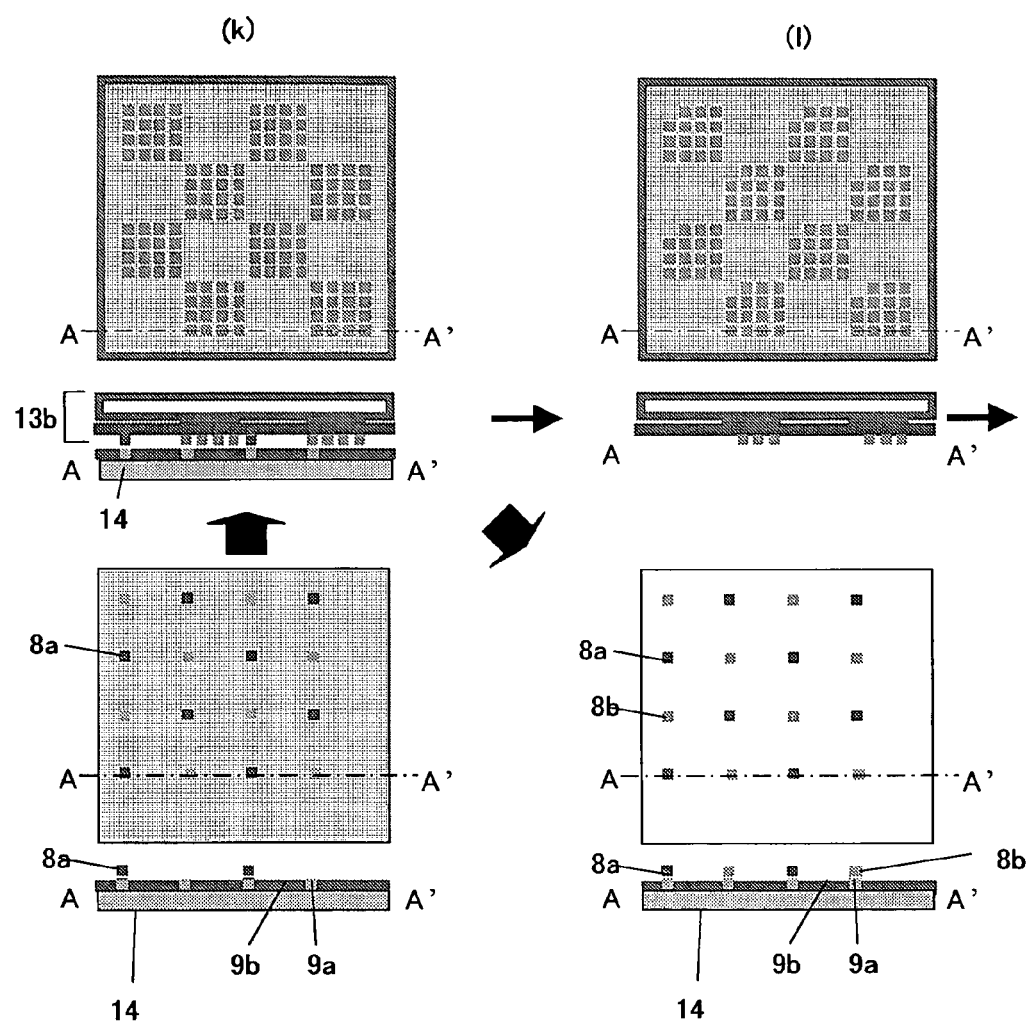
FIG. 11 shows step diagrams 5 (plan view and sectional view) illustrating the thin-film device disposition process according to the second embodiment of the invention.
Figure 12:
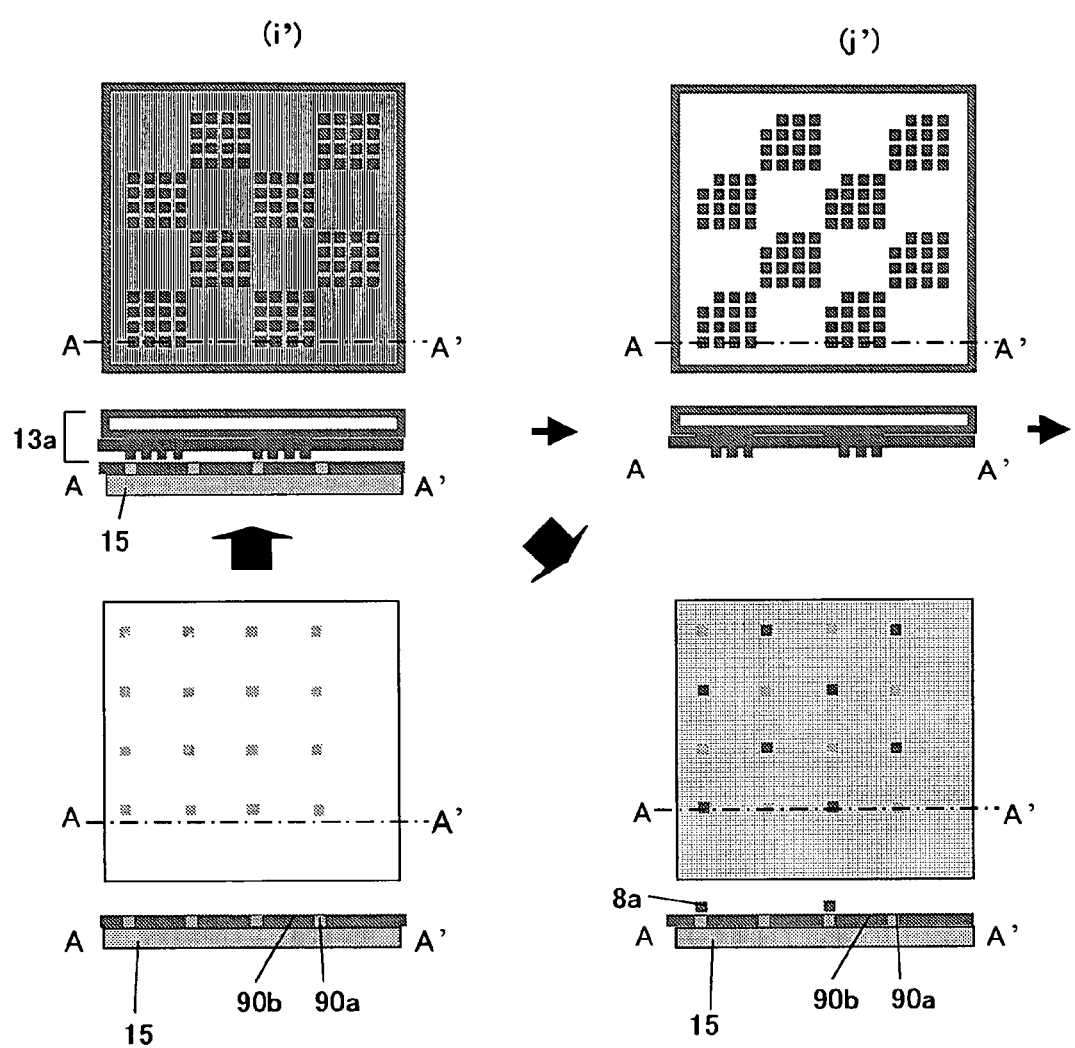
FIG. 12 shows step diagrams 4' (plan view and sectional view) illustrating a thin-film device disposition process according to the third embodiment of the invention.
Figure 13:
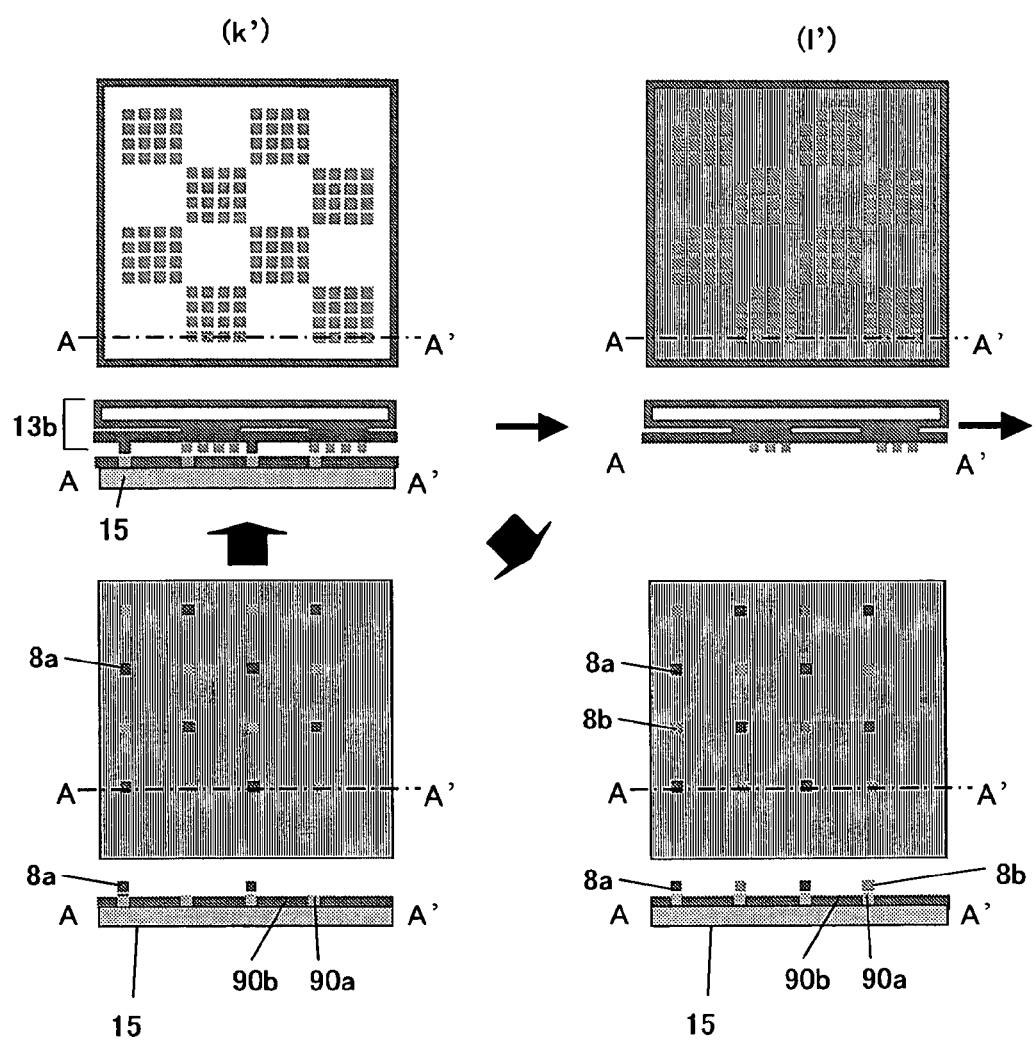
FIG. 13 shows step diagrams 5' (plan view and sectional view) illustrating the thin-film device disposition process according to the third embodiment of the invention.
Figure 14:
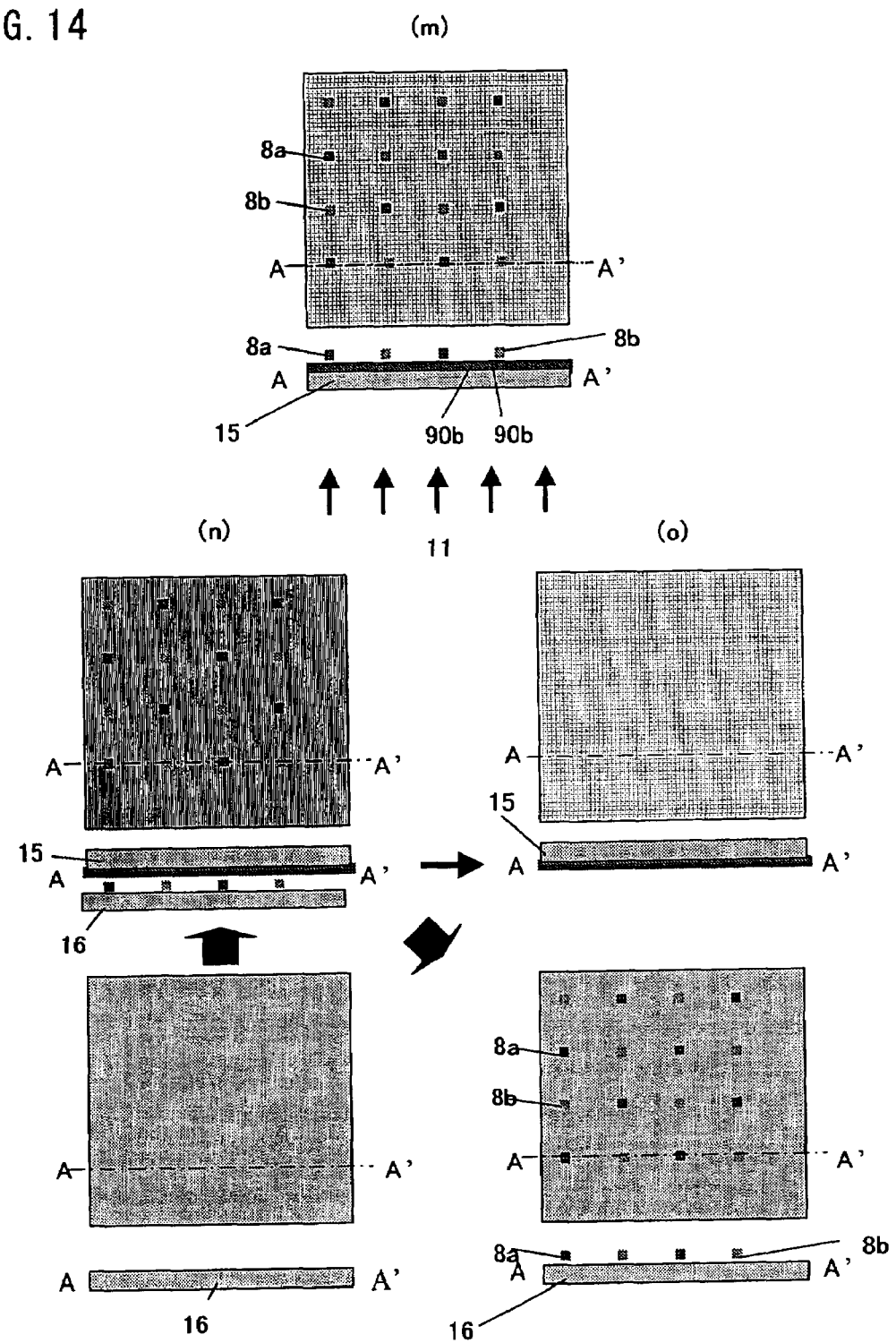
FIG. 14 shows step diagrams 6 (plan view and sectional view) illustrating the thin-film device disposition process according to the third embodiment of the invention.

A thin-film device disposition process according to the third embodiment is a variant of the second embodiment. FIG. 12 to FIG. 14 show the thin-film device disposition process according to the third embodiment. The steps shown in FIG. 7 to FIG. 9 are carried out in the same way as in the second embodiment. After those steps, an integration supporting substrate 15 is prepared as shown in FIG. 12. Then, an adhesive bond 90a on the integration supporting substrate 15 is exposed to patterned UV light as shown in FIG. 12i'.

The areas where the thin-film devices I (8a) a and the thin-film devices II (8b) will be transferred are left unexposed. The exposed part changes its property, turning into an adhesive bond 90b with reduced adhesion. The intensity of the exposure in this step is preferably higher than the exposure to the backside of the supporting substrates Sub-I. 2 (12a) and Sub-II. 2 (12b). This prevents unwanted transfer of the thin-film devices in the following step. The supporting substrate Sub-I.2 (13a) with the thin-film devices I (8a) mounted thereon is then brought into contact therewith. This transfers the thin-film devices I (8a) only to the non-UV-exposed adhesive bond 90a as shown in FIG. 12j'. The remaining thin-film devices I (8a) are subsequently transferred to another area or another substrate. With the integration supporting substrate 15, the supporting substrate Sub-II.2 (13b) with the thin-film devices II (8b) mounted thereon is brought into contact as shown in FIG. 13. This transfers the thin-film devices II (8b) only to the non-UV-exposed areas of the integration supporting substrate 15. The remaining thin-film devices II (8b) are subsequently transferred to another area or another substrate.

Then, the backside of the integration supporting substrate 15 is exposed to UV light as shown in FIG. 14m. The adhesive bond 90a directly below the thin-film devices I (8a) and the thin-film devices II (8b) turns into the adhesive bond 90b with reduced adhesion. As shown in FIG. 14n, the integration supporting substrate 15 is then brought into contact with the substantial substrate 16, thereby transferring the thin-film devices I (8a) and the thin-film devices II (8b) to the substantial substrate 16 (referring to FIG. 14O). The thin-film devices I (8a) and the thin-film devices II (8b) may be attached to the substantial substrate 16 by depositing an adhesive bond layer on the substantial substrate. Various resins such as epoxy and polyimide before complete curing may be used as the adhesion bond. A generally-used method of cold or high-temperature bonding may be also used, including metal bonding, polyimide bonding, bonding by the adhesion of the substantial substrate, and Van del Waals bonding. The above process enables one-time integration of different kinds of thin-film devices in a desired arrangement. Some of the steps in the process may be carried out in a different order.

Figure 15:
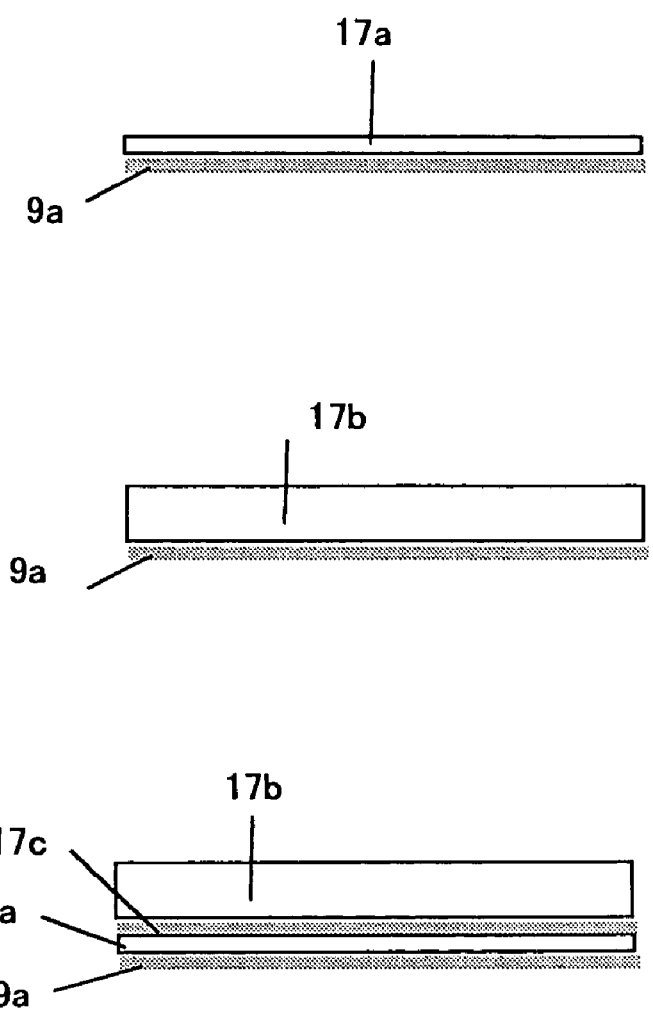
FIG. 15 shows sectional views of formation patterns of an adhesive bond according to an embodiment of the invention.

FIG. 15 shows examples of various patterns of the adhesive bond. Examples include a UV tape composed of a UV transmitting film 17a and an adhesive bond 9a (for example, the one available from Nitto Denko Co., Ltd.), the UV tape attached to a glass or quartz substrate 17b with another adhesive bond 17c, and a UV-curable adhesion directly applied to a substrate.

The above process simplifies and ensures the transfer of thin-film devices.

The LA-SORT is not limited to the above process flow. It may be used in only part of the thin-film device disposition process. It is also possible to use some part of the above process only. In addition, some part of the above process may be performed in a different order.

FIG. 6 shows the concept of the LA-SORT, taking optical switches, waveguides, micro lenses, micro prisms, and vertical waveguides as examples. This concept may be applied also to other thin-film devices including tunable filters, micro mirrors, micro filters, micro prisms, semiconductor lasers, photo detectors, optical memories, optical amplifiers, photonic crystals, ICs, and LSIs. All component thin-film devices are not necessarily formed by embedding. Part of the thin-film devices may be directly formed on a layer.

Figure 16:
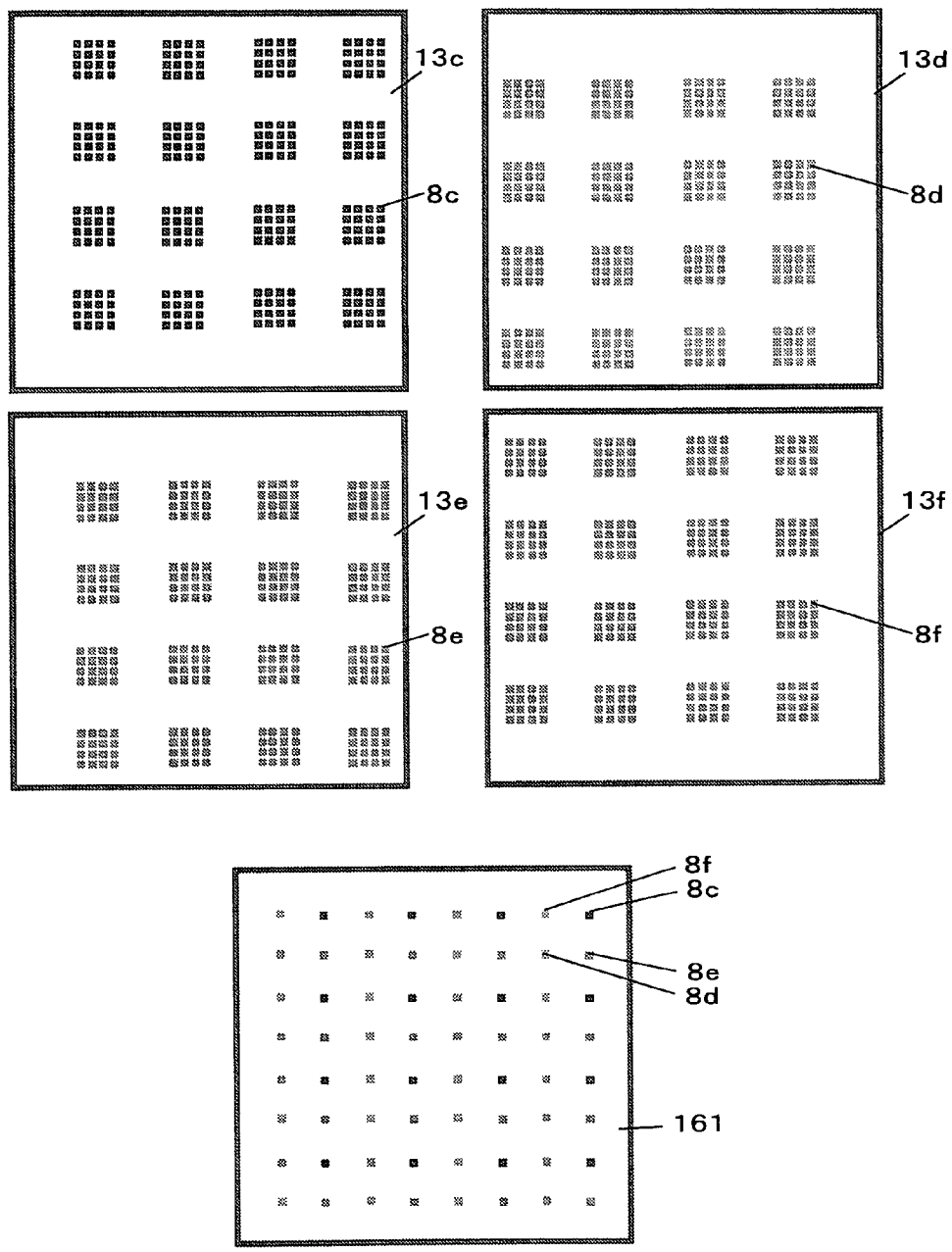
FIG. 16 shows plan views illustrating a thin-film device disposition process according to a variant of the second and third embodiments of the invention.

It is also possible to use more than two kinds of thin-film devices. Different kinds of thin-film devices are not necessarily arranged regularly. In this case, UV exposure pattern may be adjusted as desired, such as a mosaic pattern. FIG. 16 shows an exemplary arrangement pattern of four kinds of thin-film devices III (8c), IV (8d), V (8e), and VI (8f) when disposed by the LA-SORT process. The thin-film devices 8c, 8d, 8e, and 8f are formed on supporting substrates 13c, 13d, 13e, and 13f, respectively. The thin-film devices 8c, 8d, 8e, and 8f are then alternately disposed on a substantial substrate 161 by LA-SORT.

In the case of disposing optical switches and modulators which are edge input/output devices, reflection is problematic if there is a large refractive index difference at an edge. In such a case, it is preferred to perform AR coating by a film depositing process such as CVD after the thin-film device array separating step shown in FIG. 7a.

LA-SORT is a general-purpose process applicable to 3D stack architectures including 3D-MOSS device and device embedding with S-FOLM.

Embodiment 4

Figure 17:
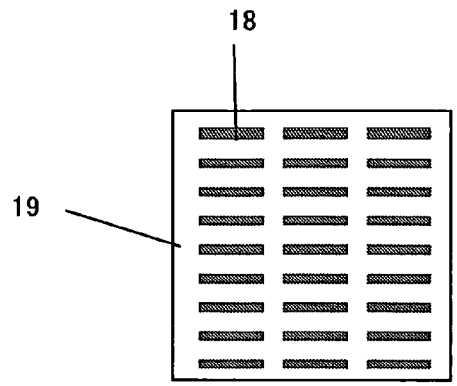
FIG. 17 is a plan view showing an embedded structure of fillers according to the fourth embodiment of the invention.

FIG. 17 shows exemplary alignment fillers created by the SORT process. A filter 18 may be made of various materials such as $SiO_2$, alumina, a thin piece of semiconductor, and a piece of metal. The interval and arrangement pattern of the fillers may be easily controlled by the processes described in the second and third embodiments. Use of a single kind of fillers can omit one step of the device transfer process to the supporting substrate or the transfer to the integration supporting substrate. Since the positions of the alignment fillers can be designed, they offer the advantage that the mechanical and thermal properties of a film 19 are controllable without interfering with the embedding of the thin-film devices.

Embodiment 5

Figure 18:
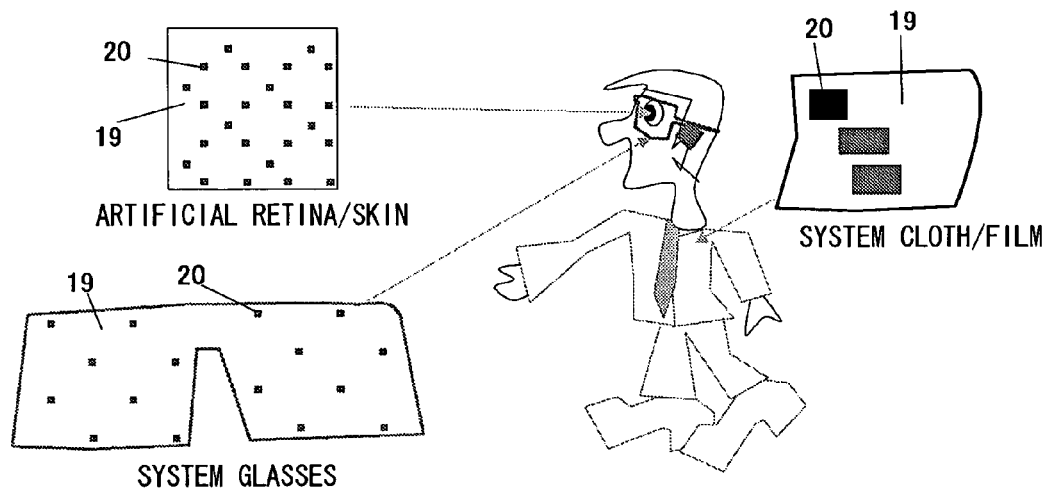
FIG. 18 shows plan views and a three-dimensional view illustrating architecture of Wearable Integrated System for Ecology (WISE) according to the fifth embodiment of the invention.

3D-MOSS according to the present invention is applicable to various wearable systems (Wearable Integrated System for Ecology (WISE)). Application examples are shown in FIG. 18. Embedding a thin-film device 20 such as a photo detector or various kinds of biosensors into a polymer film 19 produces an artificial retina or a functional artificial skin. Outputs from the thin-film devices are input to the nervous system or output to the outside. Embedding a thin-film device 20 such as a photo detector or light-emitting device into a polymer or glass film produces a pair of glasses with a camera or display function. If one pixel of a photo detector or light-emitting device is 20 μm square and a pixel pitch is 100 μm, a two-dimensional array of photo detectors or light-emitting devices occupies only one-twenty fifth of the area. Thus, with the use of transparent electrodes, light detection or display can be performed without reducing the transmission of the film. By the combination with an appropriate thin-film lens, glasses with a camera can be produced. A speaker may be integrated to the glasses by using a thin-film piezoelectric device. Further, embedding a thin-film device into a polymer film, cloth, thread, or ribbon produces a system film, cloth, thread, ribbon, and so on, creating wearable systems. The thin-film device to be embedded include an optical device such as a photo detector or a light-emitting device, or other devices able to be shaped like a thin-film such as LSI, IC, electrostrictive device (speaker), piezoelectric device (micro phone), or piezoelectric keyboard. This creates wearable systems such as a system film, cloth, thread, and ribbon with the function of PC, telephone, camera, display, battery, or the like. LA-SORT is extremely efficient as a production technology thereof.

Figure 19:
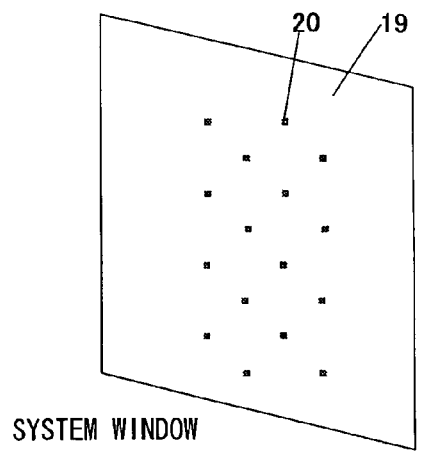
FIG. 19 is a plan view showing the structure of a functional film/glass according to the fifth embodiment of the invention.

FIG. 19 shows a case where the 3D-MOS according to this invention is applied to a window or a regular film. Such a window or glass may be called system window. In this system window, a thin-film device 20 is embedded into a window or film 19.

Embodiment 6

Figure 20:
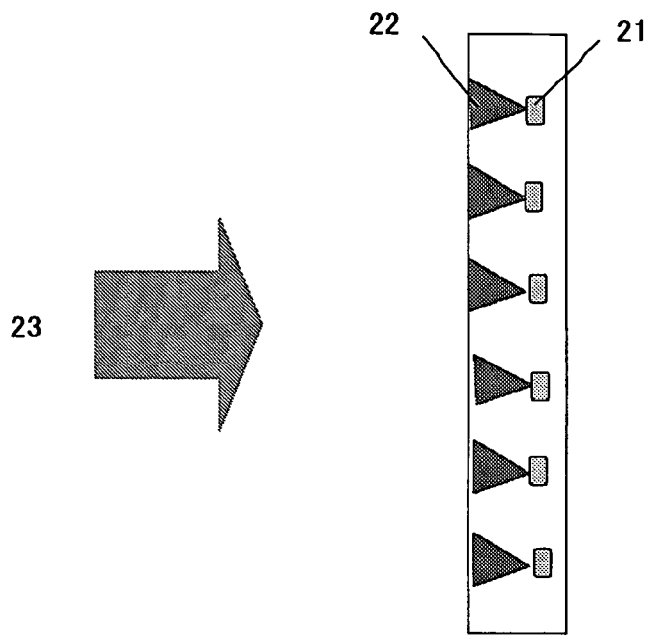
FIG. 20 is a sectional view showing the structure of a concentrating solar system according to the sixth embodiment of the invention.

FIG. 20 shows a sectional view of a concentrating solar cell created using the SORT according to the invention. Solar cell thin-film devices 21 composed of Si or III-V compound are arranged in a two-dimensional array, and concentrator 22 concentrates outside light 23. The outside light 23 concentrated by the concentrator 22 is applied to each solar cell 21. The SORT according to this invention allows reducing consumption of semiconductor material, thereby providing a low-cost solar cell module. The concentrator 22 may be a regular micro lens sheet, Fresnel lens sheet, or Self-Organizing Waveguide SOLNET. The Self-Organizing Waveguide SOLNET is disclosed in the document of T. Yoshimura, J. Roman, Y. Takahashi, W. V. Wang, M. Inao, T. Ishitsuka, K. Tsukamoto, S. Aoki, K. Motoyoshi, and W. Sotoyama, "Self-Organizing Waveguide Coupling Method "SOLNET" and its Application to Film Optical Circuit Substrates," Proc. $50^{th}$ ECTC, 962 (2000) Further, by integrating the solar cell with a film polymer battery by lamination or other techniques, it produces a solar cell with a capacitor effect. Since the module itself may be shaped like a film, it can be regarded as one kind of the above WISE, being wearable.

Embodiment 7

Figure 21:
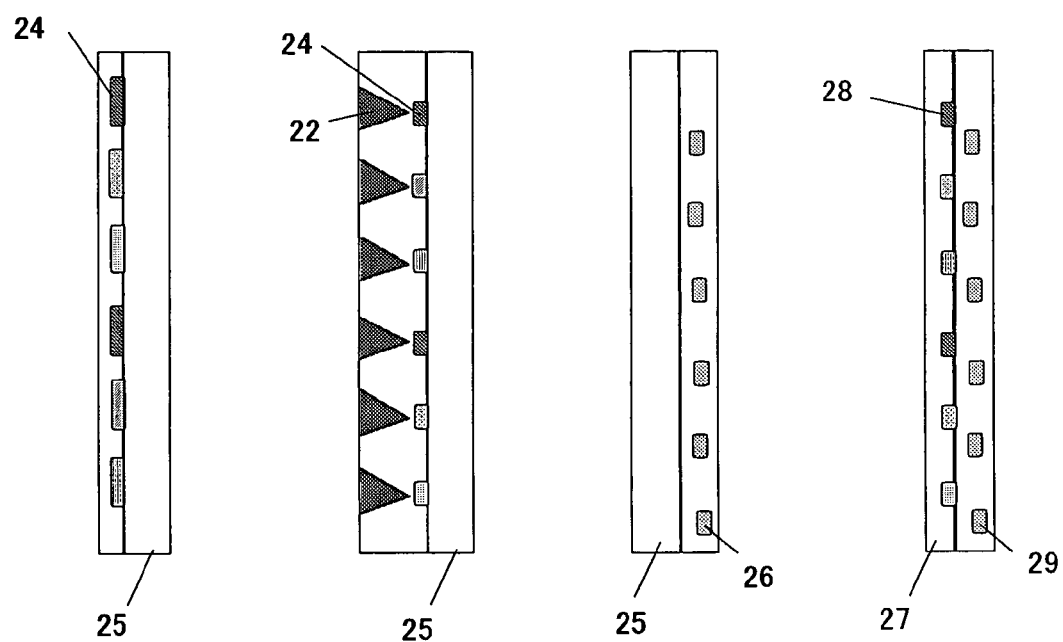
FIG. 21 shows sectional views of the structures of displays according to the seventh embodiment of the invention.

FIG. 21 shows sectional views of displays produced by using SORT. When producing a liquid crystal panel 25, LA-SORT is used in a step of creating a two-dimensional array of color filters 24. Concentrating backlight with the condenser 22 allows reducing the area of the color filter 24, thus saving filter material while enhancing panel brightness. The concentrator 22 may be a regular micro lens array, Fresnel lens array, or Self-Organizing Waveguide SOLNET. LA-SORT may be used also for creating the micro lens array or the Fresnel lens array. The SORT process is also applicable for the transfer of thin-film transistors (TFTs) 26 for liquid crystal driving. It is particularly effective when using high electron mobility transistors. The process can transfer high performance polysilicon transistors, silicon transistors, or compound semiconductor transistors separately created on a semiconductor wafer to a panel. In this process, by high-density production of the transistors on a wafer, transistors can be supplied from one wafer to multiple panels, saving material and process costs.

In the case of producing a LED panel 27, SORT is used in creating a two-dimensional array of thin-film LEDs 28. The LEDs may be either inorganic or organic. SORT may be also used in disposing TFTs 29 for LED driving.

As described in the foregoing, the invention described in the first to seventh embodiments can provide a high-speed optical switching system or wavelength switching system with a scale as large as 1000×1000 channels and with a speed as fast as microseconds to nanoseconds. It also enables various 3D micro optoelectronic systems. Further, it provides a low-cost, resource-saving, and reliable thin-film device transfer process. In addition, it allows cost reduction, resource saving, and high-density integration of various features including an optical switch, a wavelength switch, an optical transmitter, an optical receiver, an optical memory, and an optical amplifier. Besides, it has a ripple effect that allows control of the mechanical and thermal properties of the film 19 without interfering with the embedding of thin-film devices. Furthermore, it achieves a broad range of wearable system including a system film, cloth, thread, or ribbon with the functions such as PC (personal computer), telephone, camera, display, battery, and keyboard, and the artificial retina and artificial skin integrated with various sensors. It also provides a low-cost solar cell module with reduced consumption of semiconductor material. Besides, it achieves a high-performance, low-cost display capable of saving filter material and semiconductor material.

Embodiment 8

Figure 22:
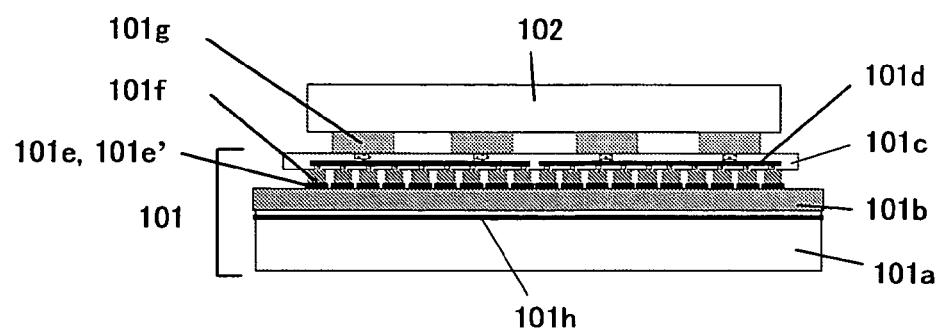
FIG. 22 shows sectional and three-dimensional schematic block diagrams of a 3D optoelectronic microsystem according to the eighth embodiment of the invention.
Figure 22:
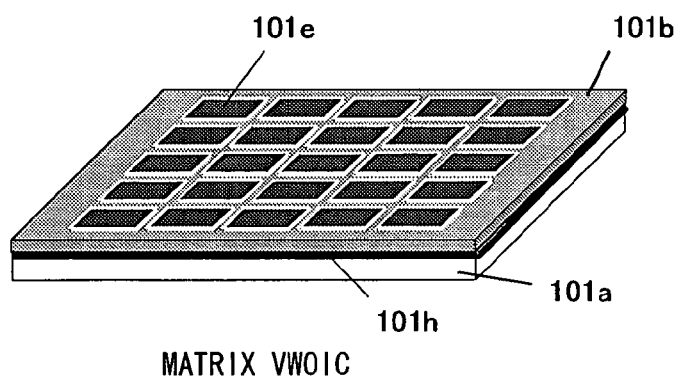
Figure 22:
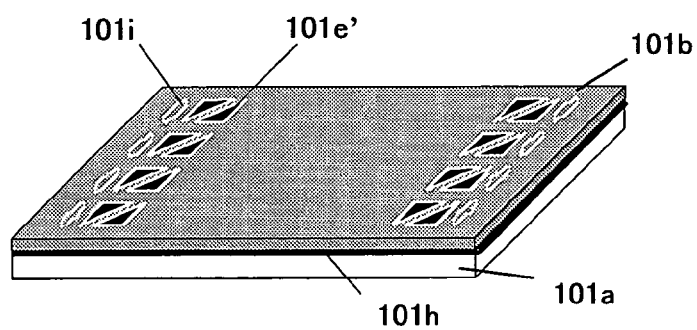
Figure 23:
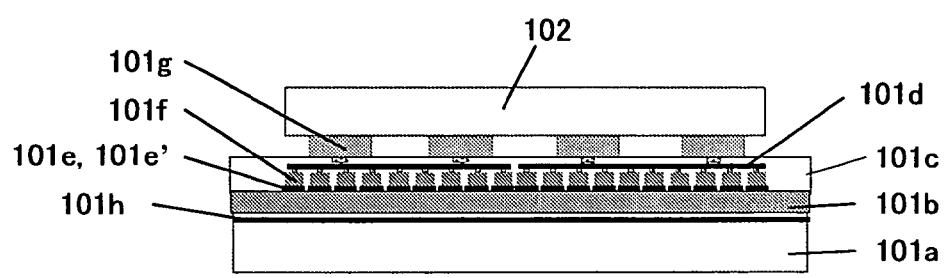
FIG. 23 shows a sectional diagram of the 3D optoelectronic microsystem according to the eighth embodiment of the invention.
Figure 24:
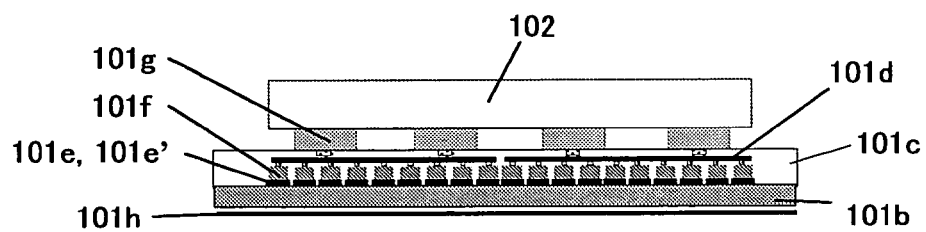
FIG. 24 shows a sectional diagram of the 3D optoelectronic microsystem according to the eighth embodiment of the invention.
Figure 25:
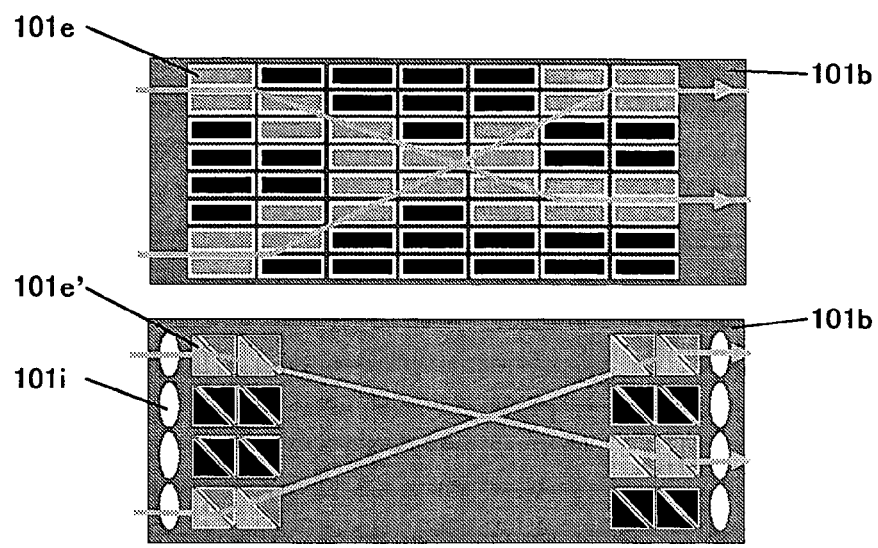
FIG. 25 shows pattern diagrams illustrating an operation of VWOIC.

Referring now to FIGS. 22, 23, and 24, structures of Variable Well Optical IC (VWOIC) that is one embodiment of the 3D optoelectronic micro system are shown. FIG. 25 schematically depicts the operational concept of VWOIC.

In a VWOIC 101, a slab waveguide 101b with an electro-optical (EO) effect is interposed between a counter electrode 101h and patterned electrodes 101e and 101e'. Each patterned electrode is connected to an output terminal of a thin-film IC 101d in an interface layer 101c by an IC-electrode bond 101f. In the example shown in FIG. 22, the VWOIC 101 is mounted on a substrate 101a. The thin-film IC 101d and a LSI 102 mounted thereabove are connected by a LSI-IC bond 1g. Used as an electro-optical material are a thin-film organic crystal and organic quantum well, quantum wire or quantum dot such as organic quantum well, quantum wire, or quantum dot composed of III-V compound, PLZT (an oxide of lead, lanthanum, zircon, titanium), $LiNbO_3$, EO polymer after polling process, DAST (4-dimethylamino-N-methylstilbazolium tosylate) and MNBA (4'nitrobenzylidene-3-acetamino-4-methoxyaniline).

Matrix VWOIC and searchlight VWOIC are shown in FIG. 22 as exemplary patterned electrodes of the VWOIC. The matrix type has a two-dimensional array of strip electrodes 101e arranged in matrix. As shown in the upper diagram of FIG. 25, selective application of voltage to the electrodes creates a dynamic waveguide due to refractive index change induced by electric field. Changing voltage application patterns enables optical switching. For example, with a 4-μm-thick slab waveguide composed of multiple quantum well (MQW) of III-V compound, a drive voltage of 10 V, and a strip electrode with the size of 2 μm×100 μm, optical switching can be performed with the switch length of approximately 700 μm.

The searchlight type, on the other hand, has an array of prism electrodes 101e'. As shown in the lower diagram of FIG. 25, selective application of voltage to electrodes creates a dynamic waveguide prism due to refractive index change induced by electric field. Changing voltage application patterns or voltages allows adjusting the deflection angle of light, thereby enabling switching. The prism electrodes generally have a paired structure to which the opposite charge voltages are applied, thereby reducing drive voltages. The PLZT that utilizes the kerr effect is not paired structure, and the same charge voltages are applied thereto. Further, cascading the prism electrodes over another row achieves further voltage reduction. Reference numeral 101i in FIG. 25 designates a waveguide lens. It reduces the spread of light in a free space of the slab waveguide. For example, when a slab waveguide composed of multiple quantum well (MQW) of III-V compound is 4 μm thick, a drive voltage is 50 V, a prism electrode has the size of 16 μm in length×16 μm in width, the number of prism cascade is 4, a refractive index of the waveguide lens is 2.0 (an external refractive index is 1.55), and a curvature radius of the waveguide lens is 20 μm, switching is possible with the switch length of approximately 400 μm. The voltage is not limited to two-valued; it may be three or more valued. It has an advantage of increased flexibility for deflection angle adjustment. The whole area of the slab waveguide is not necessarily made of EO material. It is sufficient if an electrode area or its vicinity is made of EO material. The other area may be made of epoxy, acrylic, or polyimide low-loss passive polymer waveguide material. This saves an expensive EO material and reduces transmission loss. The partial disposition of the EO material can be performed efficiently by PL-Pack with SORT, which is described later on.

Creation of the bonds located at the both sides of the interface layer 1c is critical. For example, in FIG. 22, the electrodes of the optical switches are formed in the rule of sub- to ten micrometers. The terminals of the LSI, on the other hand, are formed in the rule of several tens to several hundreds of micrometers. It is thus required that the pitch of the terminals at the interface layer having the thin-film ICs is smaller on the side to contact the optoelectronic layer having the optical switches. In FIG. 22, the interface layer is a separate film laminated with the optoelectronic layer having the optical switches, thereby making up VWOIC. In FIG. 23, the interface layer is laminated integrally with the optoelectronic layer, making up VWOIC. In FIG. 24, the substrate 101a is eliminated, and VWOIC is film-shaped.

Figure 26:
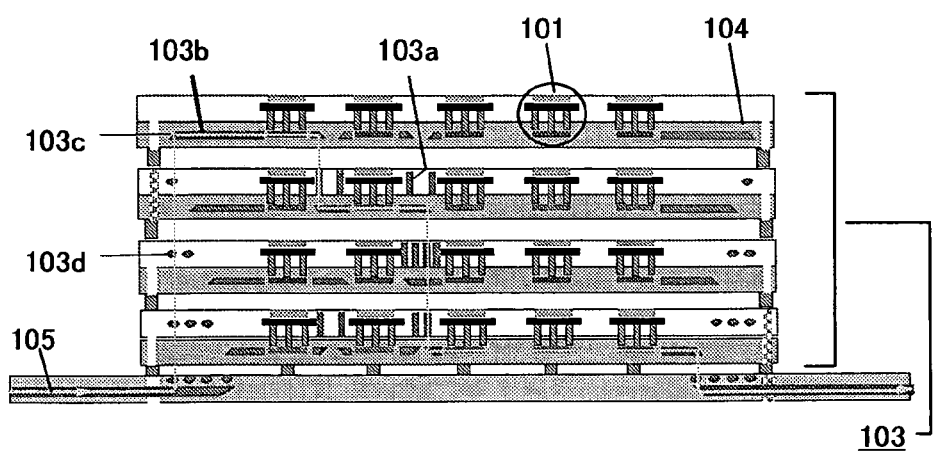
FIG. 26 shows a sectional diagram of the 3D optoelectronic microsystem according to the eighth embodiment of the invention.

FIG. 26 shows an example of 3D-MOSS 3. Multiple optoelectronic layers 104 with a waveguide 103b and VWOIC 101 are embedded therein are laminated. The layers are optically connected by an optical connection (which is called an optical z-connection) composed of a vertical waveguide 103a, a 45 degree micro mirror (or a micro filter) 103c, a micro lens 103d, and so on. Thus, incoming light 105 travels through the micro lens 103d, the 45 degree micro mirror 103c, and the waveguide 103b. It is also possible to create the optical z-connection and employs SOLNET. The thickness of the micro devices included in the optoelectronic layer is preferably 100 μm or less, and more preferably 30 μm or less. The 3D-MOSS 101 is normally placed on a base waveguide layer. This enables communication with another 3D-moss or the outside world. The base waveguide layer may have a multilayer waveguide structure. In this case, the number of optical inputs and outputs from the 3D-MOSS may be increased proportional to the number of waveguide layers, which is the same principal as a general electronic multi tip module (MCM).

The above example has explained the bonding between the optoelectronic layer and the interface layer, taking VWOIC as an example. It may be applied to the bonding between the interface layer and the optoelectronic layer embedded with other devices including total reflection optical switches, digital optical switches, semiconductor gate optical switches, various tunable filters, waveguides, 45 degrees micro mirrors, micro filters, micro lenses, micro prisms, vertical waveguides, semiconductor lasers such as VCSEL, photo detectors, optical memories, optical amplifiers composed of rare-earth doped glass waveguide and so on, and photonic crystals. Laminating these layers enhances higher-density and higher-speed 3D optoelectronic Microsystems including OE-LSI, OE-PCB, OE-MCM, smart pixel, 3D stack OE-MCM, and WDM transceiver.

Creation of the three-dimensional architecture may employ a build-up process or a film lamination process that are used in general multilayer circuit boards. The layers may be aligned by an aligner or other devices with equivalent functions, using marker and the like. The film lamination process may employ the z-connection technology that connects films by solder bonding or metal diffusion bonding, for example. In the case of the solder bonding, film alignment accuracy can be approximately 1 μm or even less than that by a self-alignment mechanism using the surface tension at the solder melting point.

Embodiment 9

Figure 27:
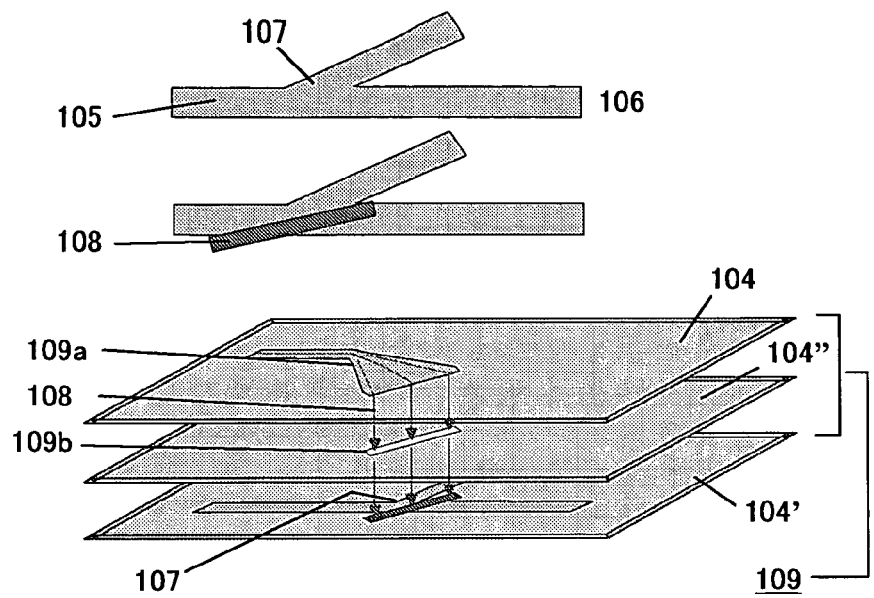
FIG. 27 shows plan views of an all-optical switch and a three-dimensional schematic block diagram of an all-optical 3D optoelectronic microsystem according to the ninth embodiment of the invention.

FIG. 27 shows an example of an all-optical 3D micro optical switching system 109. It includes an optoelectronic layer 104' having an all-optical switch 106 that uses light to switch light, the second optoelectronic layer 104 for diffusing the control light for driving the all-optical switch, and an optical z-connection for transferring the control light 108 between the second optoelectronic layer 104 and the first optoelectronic layer 104'.

The example shown in FIG. 27 uses a Y-branch digital switch having a nonlinear optical waveguide 107 as the all-optical switch 106. By applying the control light 108 to the branch point, the refractive index of the light-exposed portion changes, thereby switching guided light 105 to the branch channel. The nonlinear optical waveguide 107 may be made of quantum well, quantum wire, or quantum dot composed of III-V compound, conjugated polymer such as polydiacetylene, and so on.

The control light 108 traveling through the optoelectronic layer 104 comes out of the layer by a micro mirror, a micro filter, or other device, and is then applied to the nonlinear optical waveguide 107 of the all-optical switch 106 in the optoelectronic layer 104'. This results in switching the guided wave 105 in the optoelectronic layer 104'. The control light 108 should be applied to a predetermined part of the nonlinear optical waveguide 107 in a predetermined shape. It is thus preferred to place a mask 109b in close proximity to the nonlinear optical waveguide 107. In the example shown in FIG. 27, the mask 109b is created in an optoelectronic layer 104". Alternatively, it may be created in a clad layer of the optoelectronic layer 104'. In the Y-branch digital switch, the control light should be applied in the pattern of an elongated strip (typically, 5 μm in width, several hundred μm in length). To create such a pattern, it is preferred to widen the control light by gradually increasing the width of the waveguide in the optoelectronic layer 104 as shown in FIG. 27. A light source of the control light may be VCSEL, edge-emitting laser diode, mode-locked laser diode, and so on. The control light 108 may be optical signals from outside or another layer.

Figure 28:
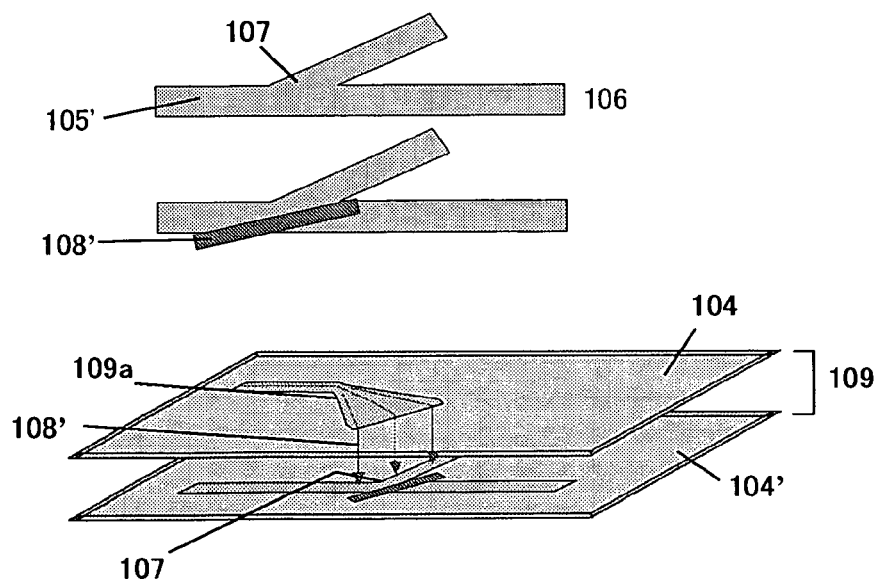
FIG. 28 shows plan views of the all-optical switch and a three-dimensional schematic block diagram of the all-optical 3D optoelectronic microsystem according to the ninth embodiment of the invention.

FIG. 28 shows another example of the all-optical 3D micro optical switching system 109. It is generally preferred that the control light has more power than the guided light. For example, it preferably has mW-kW power. To achieve this, the optoelectronic layer 104 may include an optical amplifier 109a. The optical amplifier may be a rare-earth doped waveguide amplifier or a semiconductor amplifier. Use of the optical amplifier is particularly effective when using optical signals from outside or another layer since they are often decreased. By transferring the signal light in the optoelectronic layer 104' to the optoelectronic layer 104 through the optical z-connection and amplifying the light into the control light, it increases design flexibility for all-optical circuit system. Further, the Y-branch digital switch may be used also as a wavelength conversion device 110 as shown in FIG. 28. For example, if light with the wavelength of λ2 is used as guided light 105' and light with the wavelength of λ1 is used as control light 108', the output signal at the branch is the signal light with the wavelength of λ2 which reflects the on/off status of the control light. Wavelength conversion from λ1 to λ2 is thereby performed.

Though the above examples have mainly described the case of using two optoelectronic layers, the same concept may be applied to the case of three or more layer lamination structure by creating multiple optical z-connections.

Embodiment 10

Figure 29:
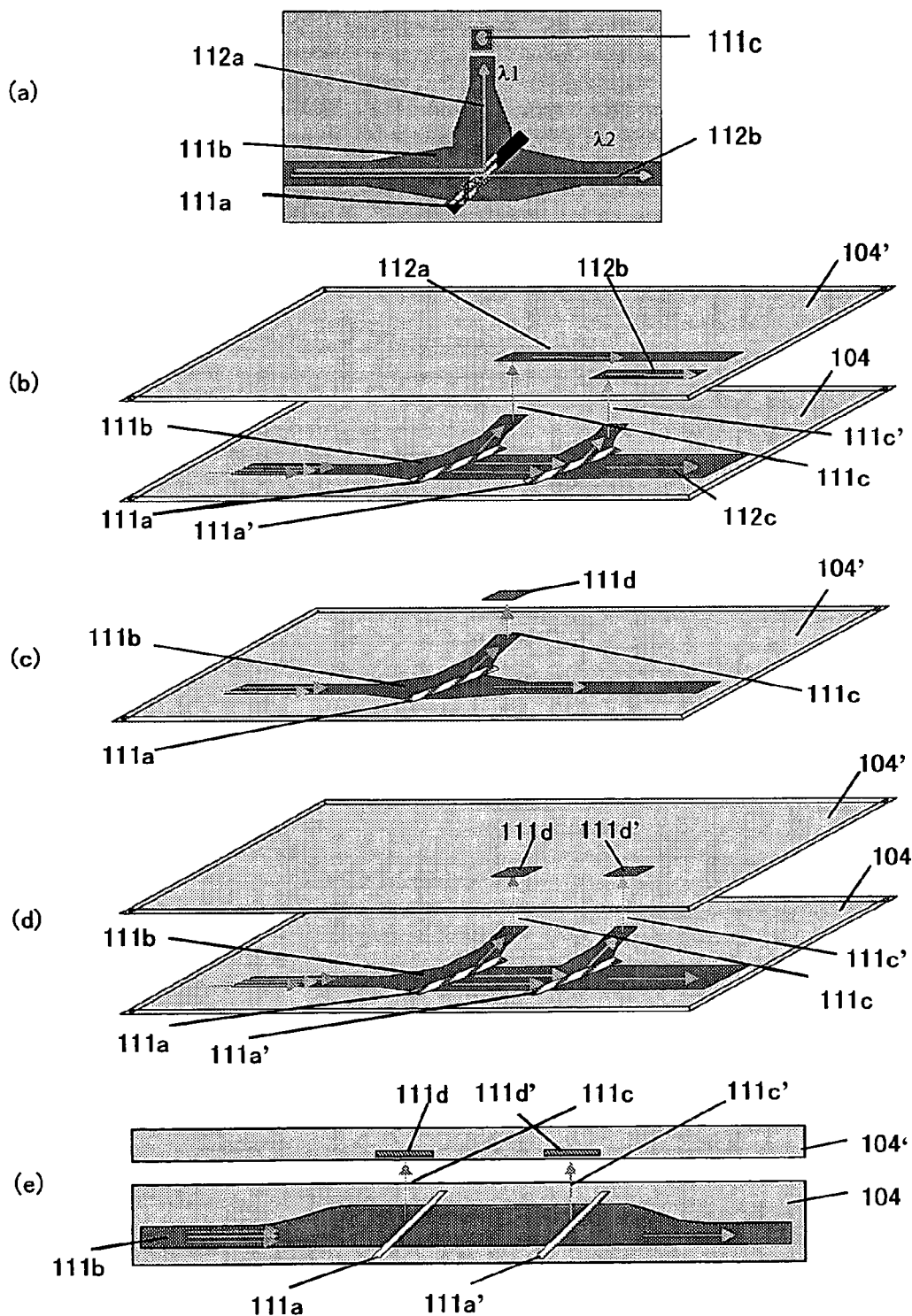
FIG. 29 shows a plan view of a micro filter and three-dimensional schematic block diagrams of a 3D optoelectronic microsystem according to the tenth embodiment of the invention.

Referring now to FIG. 29, the structure of a micro filter according to the present invention is shown. As shown in FIG. 29a, the width of the waveguide 111b gradually increases in the vicinity of the branch point. A micro filter 111a having a periodic dielectric structure is placed at the branch point, thereby splitting the light into light 1 with the wavelength of λ1 (112a) and light 2 with the wavelength of λ2 (112b). The increased width of the waveguide at the branch point causes a greater degree of light interference at the micro filter, which enables smaller wavelength intervals compared to the usual case with a constant waveguide width. The micro filter with the periodic dielectric structure may be a regular dielectric multilayer filter, a photonic crystal filter, or a grating filter, for example. Insertion of the micro filter may be performed by using AHA-SORT process which is described later.

As shown in FIG. 29b, at least one channel of a waveguide 111b branching at the place where a micro filter is to be placed in the optoelectronic layer 104 is connected to a waveguide of another optoelectronic layer 104' by using the optical z-connection 111c, thereby creating 3D optoelectronic micro system. It is also possible to connect the waveguide 111b branching at the micro filter portion to a thin-film photo detector (PD) 111d by the optical z-connection 111c as shown in FIG. 29c. Instead of the PD, the connection with various other optical devices including VCSEL and an optical switch is also feasible. When using VCSEL, the light travels in the opposite direction from the direction shown in FIG. 29c. Providing a plurality of micro filters 111a and 111a' enables wavelength division multiplexing for three or more wavelengths as shown in FIGS. 29b and 29d. In FIG. 29b, after the light splitting, the light travels through the waveguide in the optoelectronic layer 104' via the optical z-connections 111c and 111c'. In FIG. 29d, on the other hand, after the light splitting, the light enters photo detectors 111d or 111d' in the optoelectronic layer 104' via the optical z-connections 111c and 111c'. In the example shown in FIG. 29e, the width of the waveguide 111b gradually increases in the vicinity of the branch point by changing the thickness of a waveguide core. The micro filters 111a and 111a' are placed obliquely at the waveguide. This creates the light split in the z-direction. Therefore, the light splitting and z-connection can be performed at the same time, enabling high-density arrangement in the light-splitting area.

Figure 30:
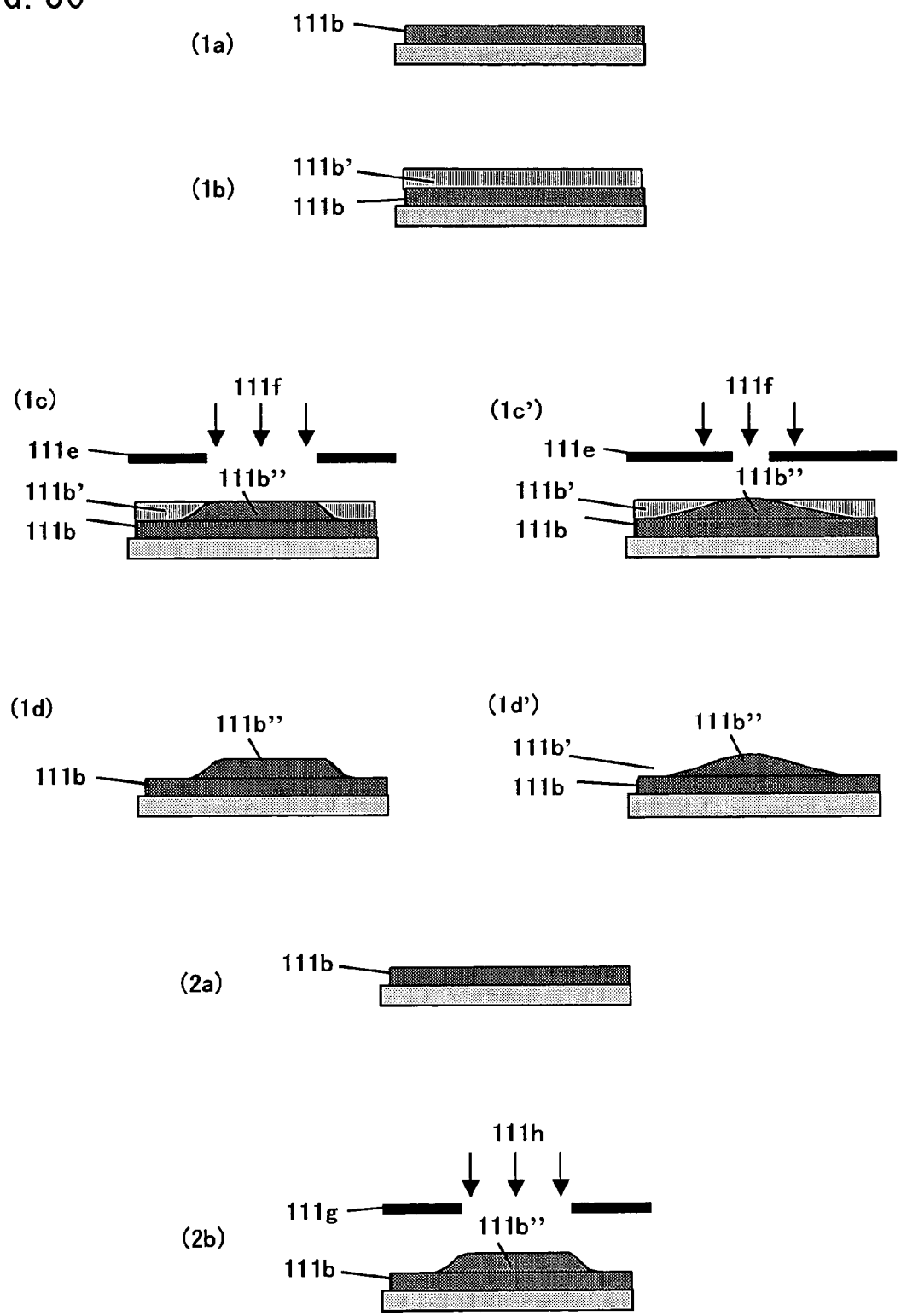
FIG. 30 shows sectional views illustrating a process of forming a tapered shape with a core thickness according to this invention.

FIG. 30 shows an exemplary process of changing the thickness of the waveguide core. The following process may be used if the waveguide core is made of a photopolymer resin.

(1a) A waveguide (core) 111b is formed.

(1b) A waveguide core material 111b' is deposited.

(1c) Exposure is performed with a gap between a photo mask 111e and the material portion.

(1d) An obscure pattern is thereby created, which causes a tapered shape, producing a gradual increase of thickness. The width of the gap is selected from 10 μm to 1 cm according to the desired size of a tapered slope. A narrower slit of the mask as shown in FIG. 30-1c' gives a wider diffraction pattern of exposure light, creating a wider tapered portion 111b" as shown in FIG. 30-1d'.

If, on the other hand, the waveguide core is formed by organic chemical vapor deposition using a fluorinated polyimide for example, the following process may be used.

(2a) A base layer 111b which serves as a waveguide (core) is formed.

(2b) A shadow mask is placed above the base layer 111b with a gap therebetween. A waveguide core layer 111b" is then created by regular organic chemical vapor deposition (vapor deposition polymerization) 111h using the mask 111g. A monomer material used is, for example, 6FDA {2,2'-bis-(3, 4-carboxyphenyl)-hexafluoropropane} and Bis-OAF {2,2'-bis-[4-(4-aminophenoxy)phenyl]-hexafluoropropane}. The width of the gap is selected from 10 µm to 1 cm according to the size of a tapered slope and the gas pressure in the film deposition. Further, a waveguide core pattern is created by reactive ion etching (RIE) and so on.

The above processes allow control of the core thickness.

In the above two examples, oblique RIE or oblique laser ablation is further performed to create a slope in the waveguide, and then a micro filter is disposed by the SORT process. The result is the structure shown in FIG. 29e. Alternatively, use of a photonic crystal or a filter where the periodic dielectric structure is obliquely formed previously eliminates the need for slope creation. Thus, a micro filter which can be also used in the optical z-connection can be created with vertical insertion.

Further, by making at least part of the micro filter having the periodic dielectric structure with a nonlinear optical material, a tunable filter that operates by control light or a voltage can be produced.

Embodiment 11

Figure 31:
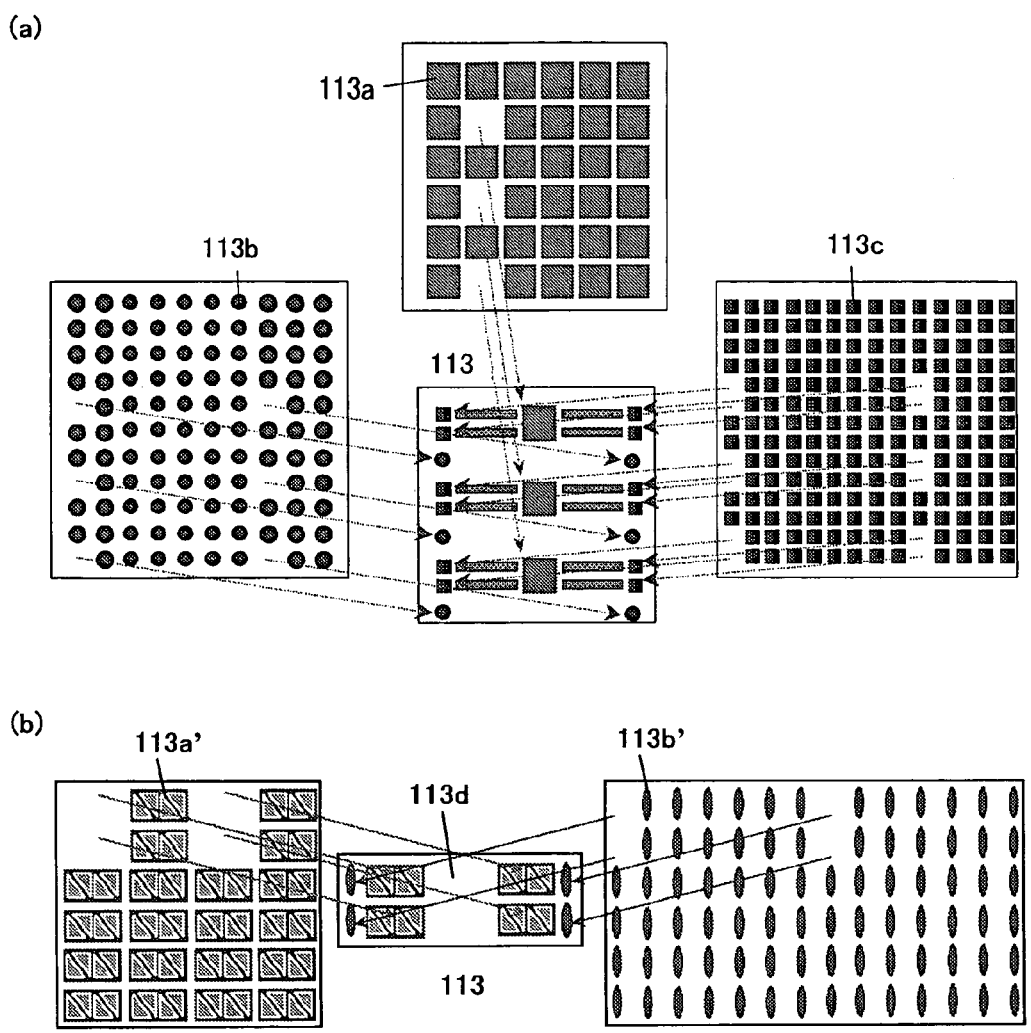
FIG. 31 shows plan views illustrating the concept of a micro device transfer and disposition process according to this invention.
Figure 32:
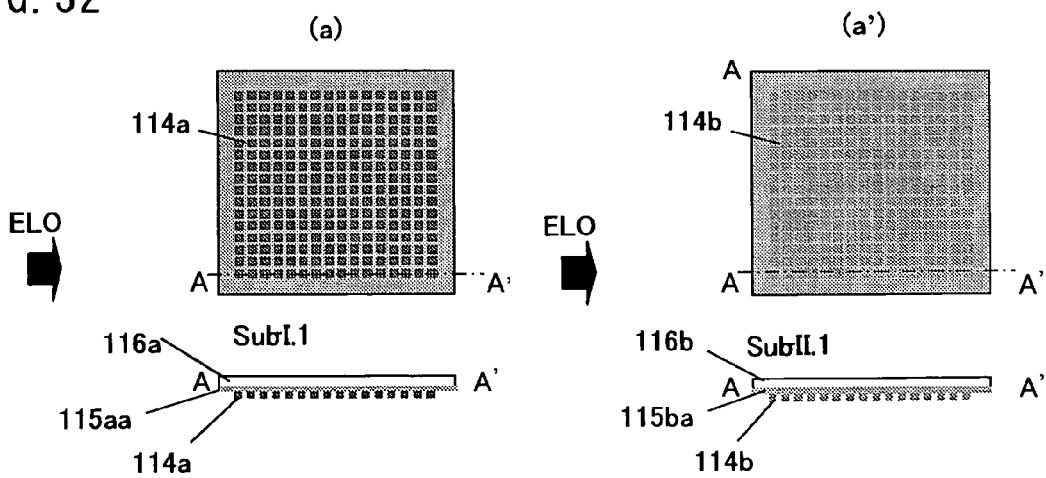
FIG. 32 shows step diagrams 1 (plan view and sectional view) illustrating a micro device disposition process according to the eleventh embodiment of the invention.

FIG. 31 illustrates the concept of a micro-device disposition process. FIG. 31a shows the case of integrating thin-film optical switches 113a, thin-film micro lenses 113b, and thin-film micro filters 113c onto a waveguide substrate. A high-density array of each of the thin-film optical switches 113a, thin-film micro lenses 113b, and thin-film micro filters 113c is created on a separate substrate. After several steps are performed, part of each micro device array is transferred and integrated altogether onto a substrate 113. The remaining micro devices are transferred to another substrate or another place of the same substrate. The micro devices are thus supplied from a single array to several substrates or places. FIG. 31b shows the case of integrating thin-film optical switches 113a' comprising an EO thin-film and prism electrodes formed thereon, and thin-film waveguide lenses 113b' onto a substrate. A high-density array of each of the thin-film optical switches 113a' and the thin-film waveguide lenses 113b' is created on a separate substrate. After several steps, part of each micro device array is transferred and integrated altogether onto the substrate 113. The remaining micro devices are transferred to another substrate or another place of the same substrate. Thus, the micro devices are supplied from a single array to several substrates or places. By forming a passive slab waveguide 113d in the substrate, an optical switch part of a searchlight VWOIC may be created.

The above concept may be applied similarly to various other devices including tunable filters, waveguides, micro mirrors, micro prisms, vertical waveguides, semiconductor lasers, photo detectors, optical memories, optical amplifiers, photonic crystals, color filters, thin-film transistors, light-emitting devices, ICs, LSIs, capacitors, inductors, resistors, electrostrictive devices, piezoelectric devices, fillers, and biosensors. This specification categorizes simple thin-films as one kind of thin-film devices.

FIG. 32 to FIG. 36 show an detailed exemplary flow of "Adhesive Hierarchy Assist SORT (AHA-SORT)" according to this invention in the case of integrating two kinds of micro devices. An array of micro devices I (114a) created on a wafer is transferred to a supporting substrate Sub-I. 1 (116a) with an adhesive bond 115aa formed thereon by ELO or other techniques. Similarly, an array of micro devices II (114b) created on a wafer is transferred to a supporting substrate Sub-II. 1 (116b) with an adhesive bond 115ba formed thereon. The ELO is a technique that picks up an epitaxial layer part onto another substrate by removing a wafer, which is a standard process for III-V compound semiconductor lasers (including VCSEL), tunable filters, photo detectors, photonic crystals, and ICs. For polymer waveguides, vertical waveguides, micro lenses, or other devices created on a Si wafer, the similar micro device pickup as ELO may be performed by etching away the Si. Further, for rare-earth-ion-doped glass waveguide amplifiers, glass waveguides, vertical waveguides, micro lenses, other devices, the similar micro device pickup as ELO may be performed by interposing an etch stop layer between a Si or glass substrate and micro devices. The pickup of the micro devices is also feasible by processing a thin-film glass sheet, a thin-film plate, or a plastic sheet. Another way to pick up the micro devices is creating the above optical devices by anodic oxidation of aluminum and so on, and then removing a metal part. Alternatively, a technique that uses a peel-off layer is also effective. For example, in the case of MNBA (m-Nitrobenzoic acid), a MNBA thin-film crystal is created on a peel-off layer (for example, PVA; polyvinil alchol). Electrodes are then formed. The devices are now divided by RIE (Reactive Ion Etching) in $CF_4/O_2$ mixed gas. Then, a supporting substrate is brought into contact with the surface, and the peel-off layer is removed by water dissolution, thereby picking up the micro devices of MNBA onto the supporting substrate. The similar process may be applied to DAST (4-dimethylamino-N-methyl-4 stilbazolium tosylate). Another pickup technique is dividing a thin-film (for example, ≦10 µm thick) of PLZT and creating an array thereof. The process to be described later (FIG. 43) is one of the micro device pickup techniques. Further it is also possible to create the micro devices I and II directly on the adhesive bonds 115aa and 115ba, respectively.

Figure 33:
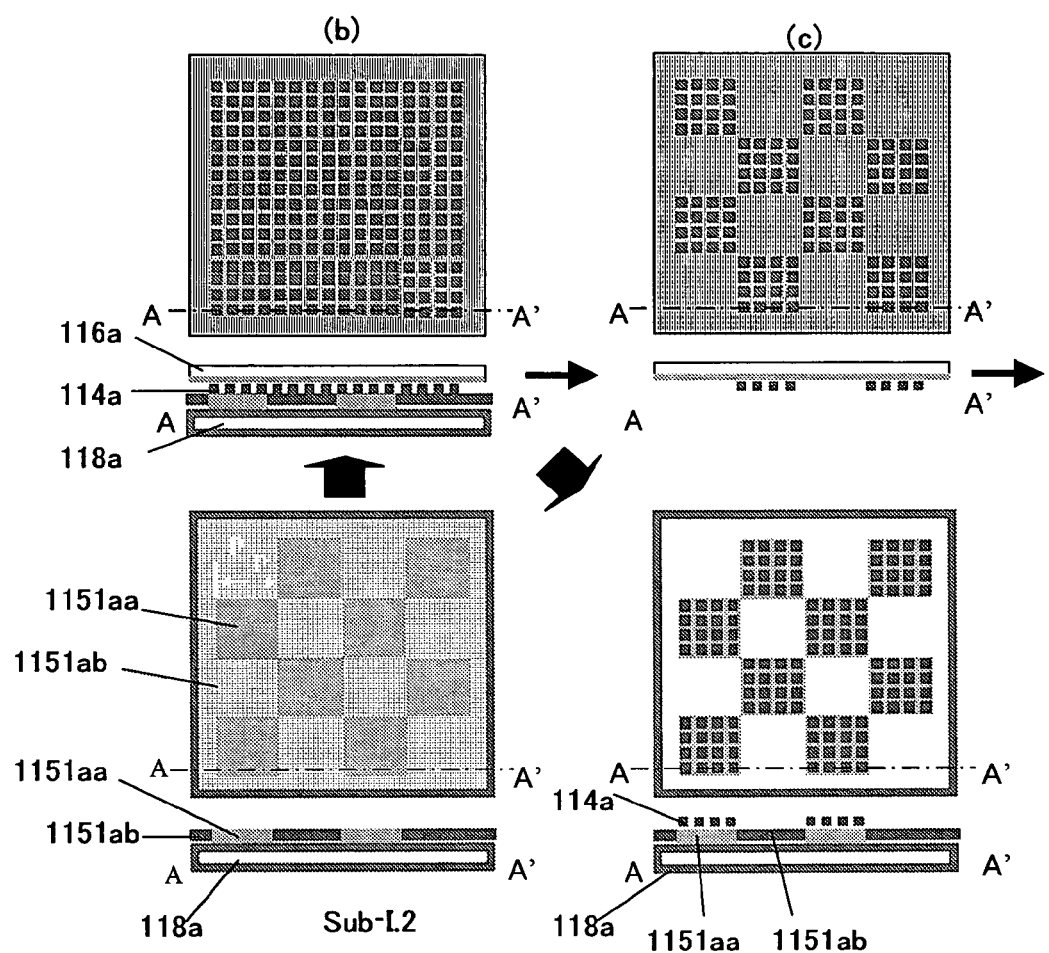
FIG. 33 shows step diagrams 2 (plan view and sectional view) illustrating the micro device disposition process according to the eleventh embodiment of the invention.

On the other hand, as shown in FIG. 33, an adhesive bond 1151aa on a supporting substrate Sub-I.2 (118a) is provided with an adhesive pattern in which an adhesive strength is different from part to part with a desired distribution. In this embodiment, for example, the adhesive bond 1151aa is the area with a higher adhesive strength, while an adhesive bond 1151ab is the area with a lower adhesive strength. This prevents unwanted transfer of micro device in the following steps. Then, the supporting substrate Sub-I. 2 (118a) is contact-bonded to the supporting substrate Sub-I. 1 (116a). This transfers the micro devices I (114a) only to the area of the adhesive bond 1151aa having a higher adhesive strength. The remaining micro devices 114a left on the supporting substrate Sub-I. 1 (116a) are transferred to another supporting substrate or another part of the same substrate. The adhesive bond 1151aa preferably has a higher adhesive strength than the adhesive bond 115aa, and the adhesive bond 1151ab preferably has a lower adhesive strength than adhesive bond 115aa.

Figure 34:
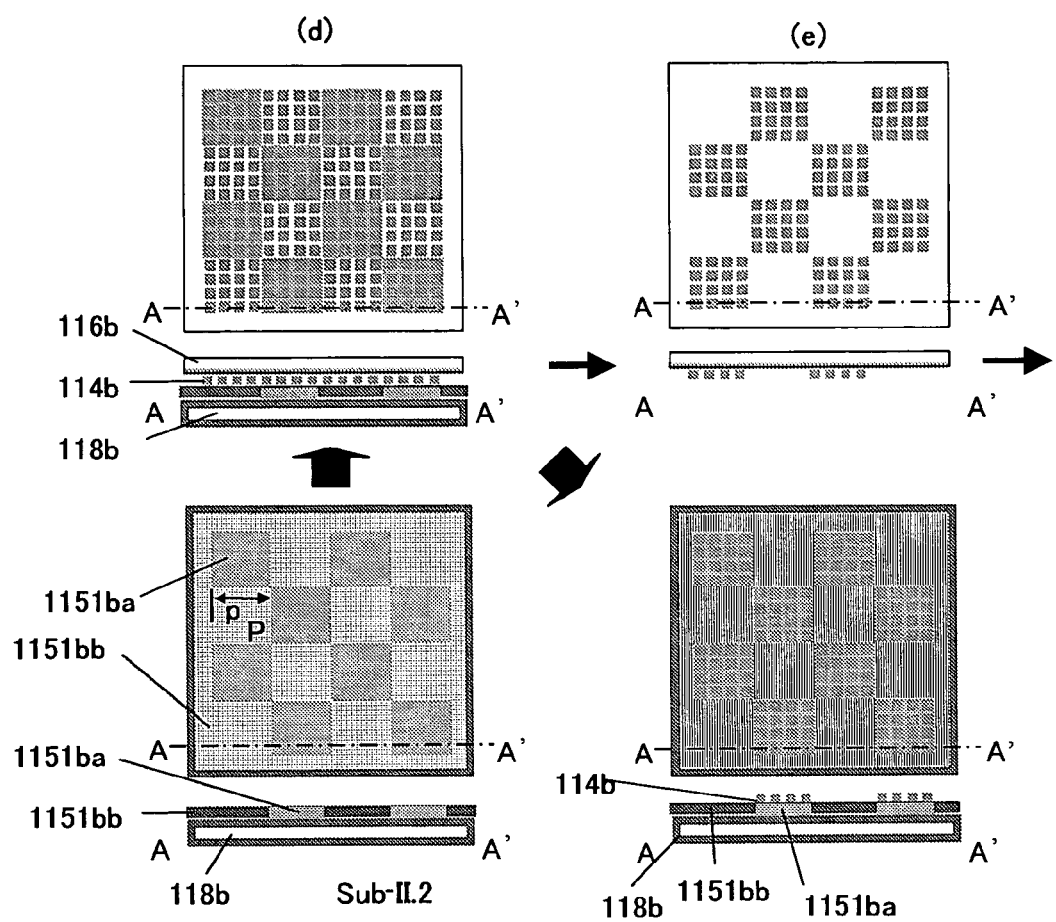
FIG. 34 shows step diagrams 3 (plan view and sectional view) illustrating the micro device disposition process according to the eleventh embodiment of the invention.

As shown in FIG. 34, an adhesive bond 1151ba on a supporting substrate Sub-I.2 (118b) is provided with an adhesive pattern in which an adhesive strength is different from part to part with a desired distribution. In this embodiment, for example, the adhesive bond 1151ba is the area with a higher adhesive strength, while an adhesive bond 1151bb is the area with a lower adhesive strength. The supporting substrate Sub-I. 2 (118b) is then contact-bonded to the supporting substrate Sub-I. 1 (116b), thereby transferring the micro devices II (114b) only to the area of the adhesive bond 1151ba having a higher adhesive strength. The remaining micro devices 114b left on the supporting substrate Sub-II. 1 (116b) are transferred to another supporting substrate or another part of the same substrate. It is preferred that the adhesive bond 1151*ba* has a higher adhesive strength than the adhesive bond 115*ba* while the adhesive bond 1151*bb* has a lower adhesive strength than adhesive bond 115*ba*.

Figure 35:
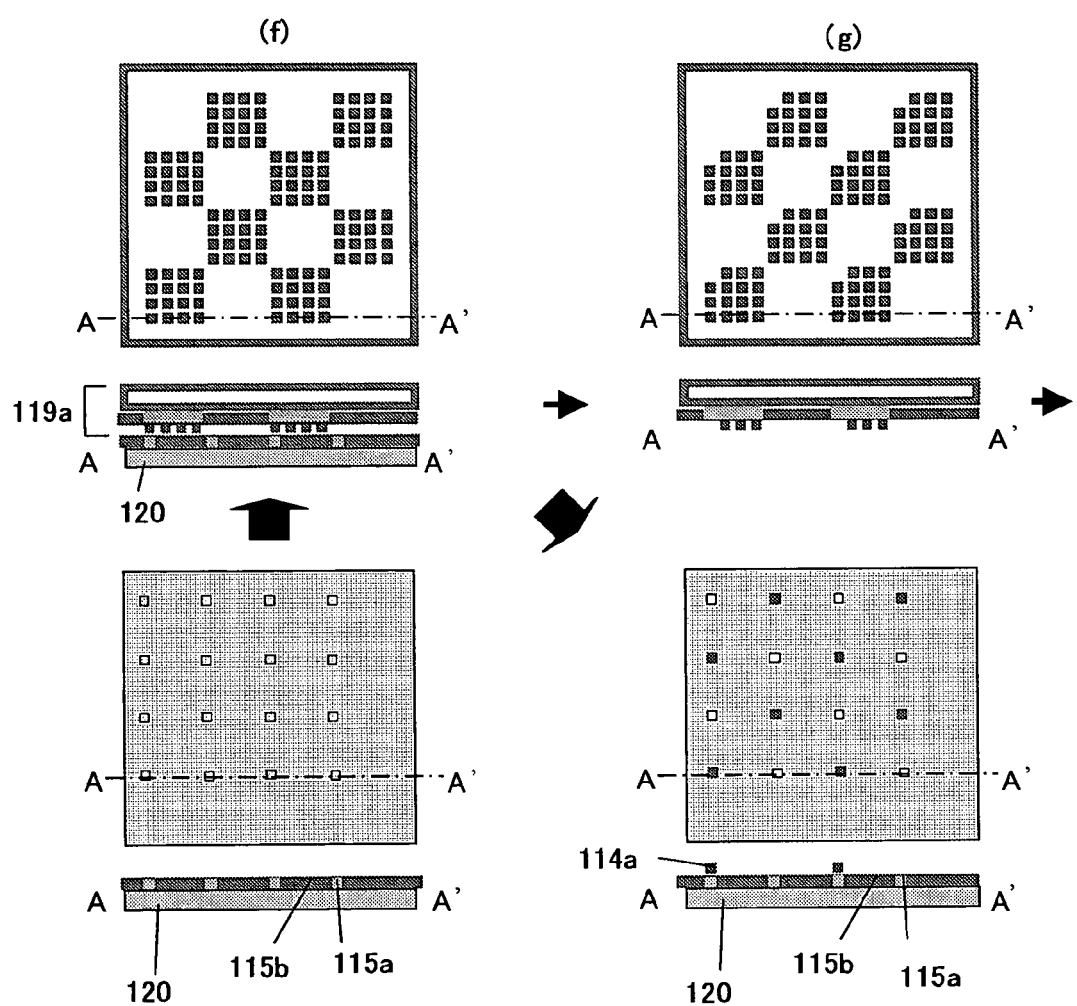
FIG. 35 shows step diagrams 4 (plan view and sectional view) illustrating the micro device disposition process according to the eleventh embodiment of the invention.

Further, as shown in FIG. 35, an adhesive bond 115*a* on a substantial substrate 120 is provided with an adhesive pattern in which an adhesive strength is different from part to part with a desired distribution. In this embodiment, for example, the adhesive bond 115*a* is the area with a higher adhesive strength, while an adhesive bond 115*b* is the area with a lower adhesive strength. This prevents unwanted transfer of micro device in the following steps.

Figure 36:
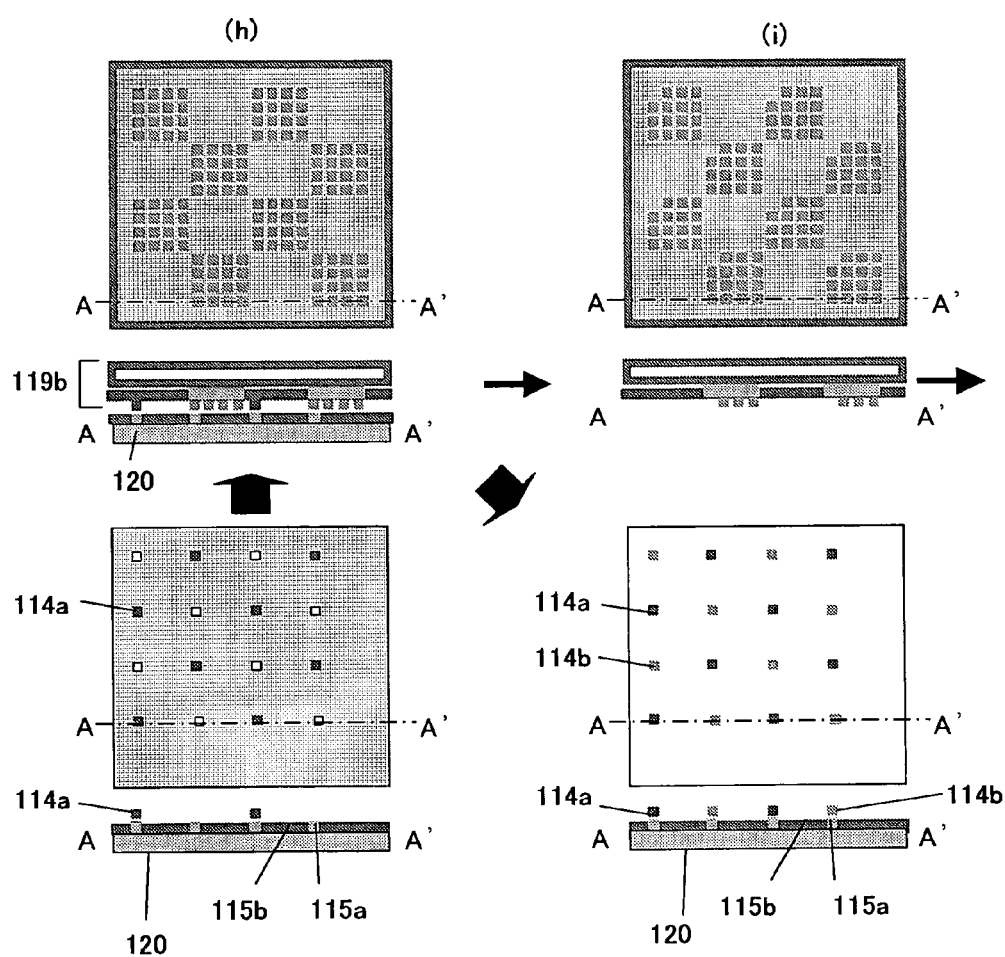
FIG. 36 shows step diagrams 5 (plan view and sectional view) illustrating the micro device disposition process according to the eleventh embodiment of the invention.

The supporting substrate Sub-I.2 (118*a*) with the micro devices I (114*a*) mounted thereon is then brought into contact with the substantial substrate 120. This transfers the micro devices I (114*a*) only to the areas of the adhesive bond 115*a* with a strong adhesion. The remaining micro devices I (114*a*) left on the supporting substrate Sub-I.2 (118*a*) are subsequently transferred to another substantial substrate or another part of the same substantial substrate. With the substantial substrate 120, the supporting substrate Sub-II.2 (118*b*) with the micro devices II (114*b*) mounted thereon is brought into contact as shown in FIG. 36. This transfers the micro devices II (114*b*) only to the areas of the adhesive bond 115*a* with a strong adhesion. The remaining thin-film devices II (114*b*) are subsequently transferred to another substantial substrate or another part of the same substantial substrate. The different kinds of micro devices can be thereby integrated altogether in a desired arrangement. It is preferable that the adhesive bond 115*a* has a higher adhesive strength than the adhesive bonds 1151*aa* and 1151*ba* while the adhesive bond 115*b* has a lower adhesive strength than adhesive bonds 1151*aa* and 1151*ba*.

Embodiment 12

Figure 37:
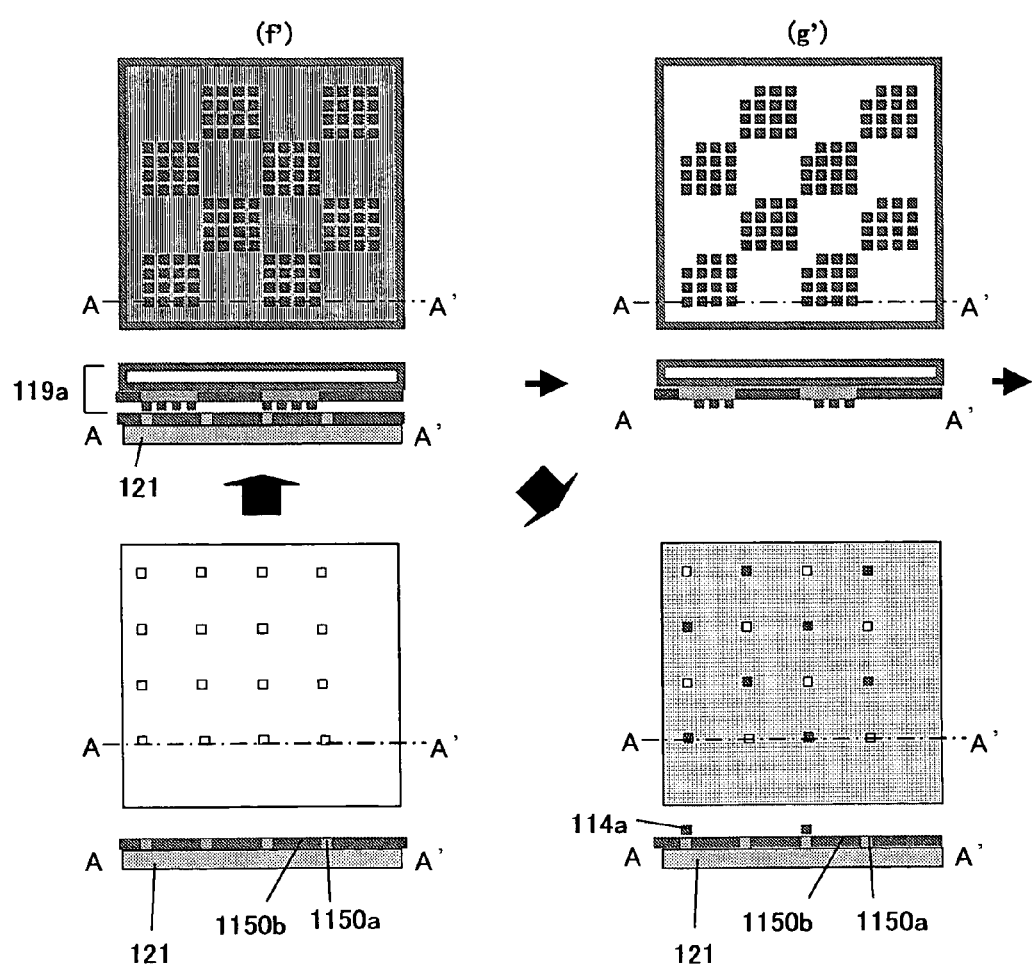
FIG. 37 shows step diagrams 4' (plan view and sectional view) illustrating a micro device disposition process according to the twelfth embodiment of the invention.
Figure 38:
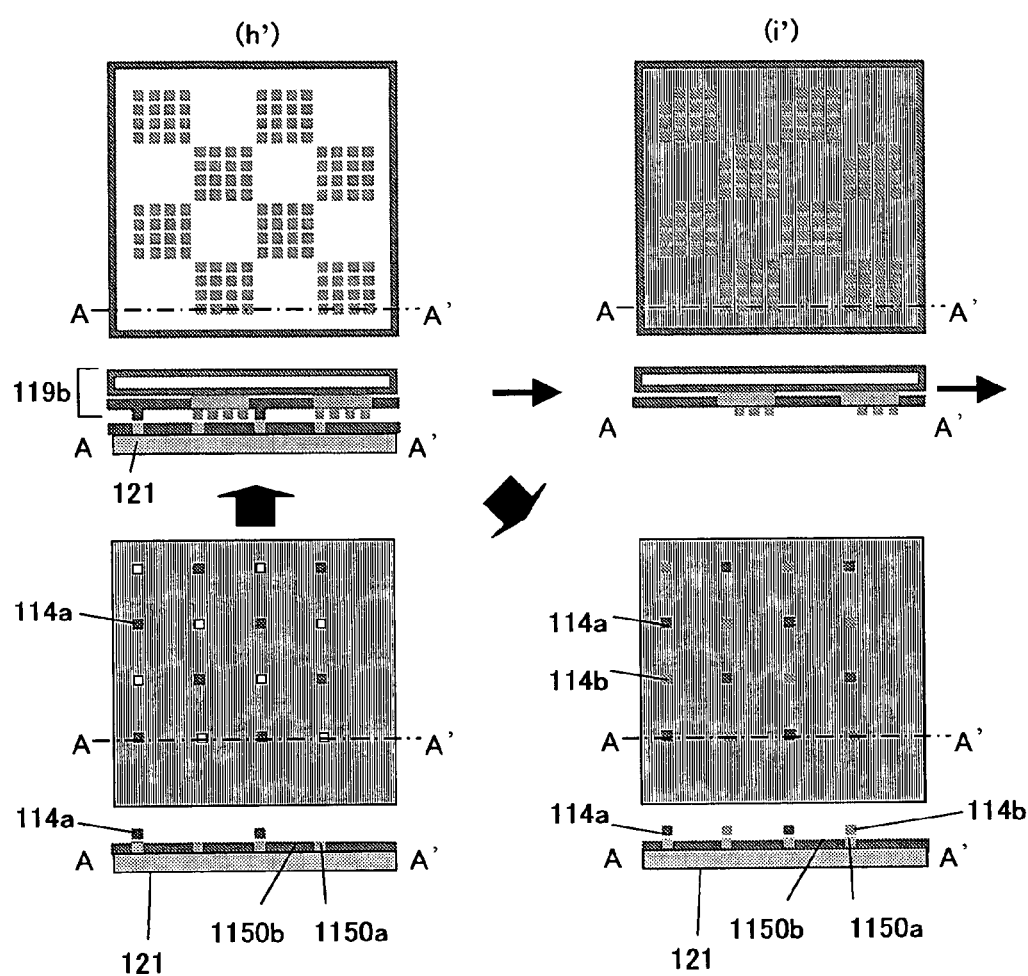
FIG. 38 shows step diagrams 5' (plan view and sectional view) illustrating the micro device disposition process according to the twelfth embodiment of the invention.
Figure 39:
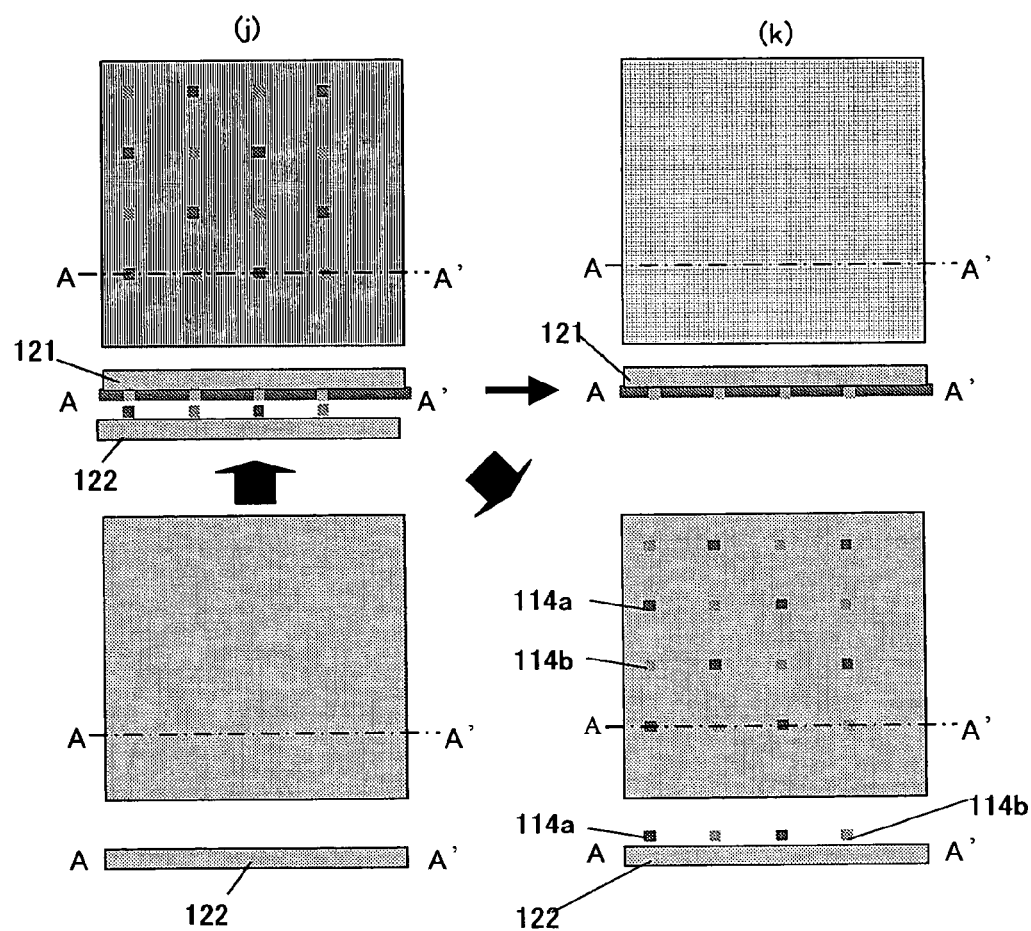
FIG. 39 shows step diagrams 6 (plan view and sectional view) illustrating the micro device disposition process according to the twelfth embodiment of the invention.

FIG. 37 to FIG. 39 show another process flow of AHA-SORT. The first half of the process may be the process steps a, b, c, and d shown in FIG. 32 to FIG. 34. Then, as shown in FIG. 37, an integration supporting substrate 121 is prepared. An adhesive bond 1150*a* on the integration supporting substrate 121 is provided with an adhesive pattern in which an adhesive strength is different from part to part with a desired distribution. In this embodiment, for example, the adhesive bond 1150*a* is the area with a higher adhesive strength, while an adhesive bond 1150*b* is the area with a lower adhesive strength. The area where the micro device I (114*a*) and the micro device II (114*b*) will be transferred is the area of the adhesive bond 1150*a* with a strong adhesion. This prevents unwanted transfer of micro device in the following steps. The supporting substrate Sub-I.2 (118*a*) with the micro devices I (114*a*) mounted thereon is then brought into contact with the integration supporting substrate 121. The micro devices I (114*a*) are thereby transferred only to the area of the adhesive bond 1150*a* with a strong adhesion. The remaining micro devices I (114*a*) left on the supporting substrate Sub-I.2 (118*a*) are subsequently transferred to another integration supporting substrate or another part of the same integration supporting substrate. With the integration supporting substrate 121, the supporting substrate Sub-II.2 (118*b*) with the micro devices I (114*b*) mounted thereon is brought into contact as shown in FIG. 38. The micro devices II (114*b*) are thereby transferred only to the area of the adhesive bond 1150*a* with a strong adhesion. The remaining micro devices II (114*b*) left on the supporting substrate Sub-II.2 (118*b*) are subsequently transferred to another integration supporting substrate or another part of the same integration supporting substrate. The micro devices I (114*a*) and the micro devices II (114*b*) are thereby integrated onto the integration supporting substrate 121. It is preferred that the adhesive bond 1150*a* has a higher adhesive strength than the adhesive bonds 1151*aa* and 1151*ba* while the adhesive bond 1150*b* has a lower adhesive strength than adhesive bonds 1151*ab* and 1151*bb*.

Further, the integration supporting substrate 121 is brought into contact with an substantial substrate 122 to transfer the micro devices I (114*a*) and the micro devices II (114*b*) to the substantial substrate 122 as shown in FIG. 39. The micro devices I (114*a*) and the micro devices II (114*b*) may be attached to the substantial substrate 122 by providing an adhesion to the substantial substrate. The adhesion may be provided by forming various resin layers such epoxy and polyimide before complete curing. A generally-used cold or high-temperature bonding process may be also used, including metal bonding, polyimide bonding, bonding by the adhesion of a substantial substrate itself, and Van del Waals bonding. Other applicable methods are a surface modification processing with molecular adsorption and creation of an irregular pattern on the surface. The adhesive strength of the substantial substrate is preferably higher than that of the adhesive bond 1150*a*. Different kinds of micro devices may be thereby integrated altogether onto the substantial substrate in a desired arrangement.

Though all substrates are the same size in the above explanation of the process for simplicity, the substrates may be different sizes when carrying out the same process. For example, if the supporting substrate 18*a* is larger than the substantial substrate 20 in the steps f and g shown in FIG. 35, the micro devices may be transferred from part of the supporting substrate to the substantial substrate. By adjusting the positional relationship of the two substrates, the transfer of the micro devices from the entire supporting substrate to the substantial substrate may be performed effectively. In the contrary case, the substantial substrate is considered by divided into several areas having the same size as the supporting substrate, and the micro devices are transferred to each area.

Figure 40:
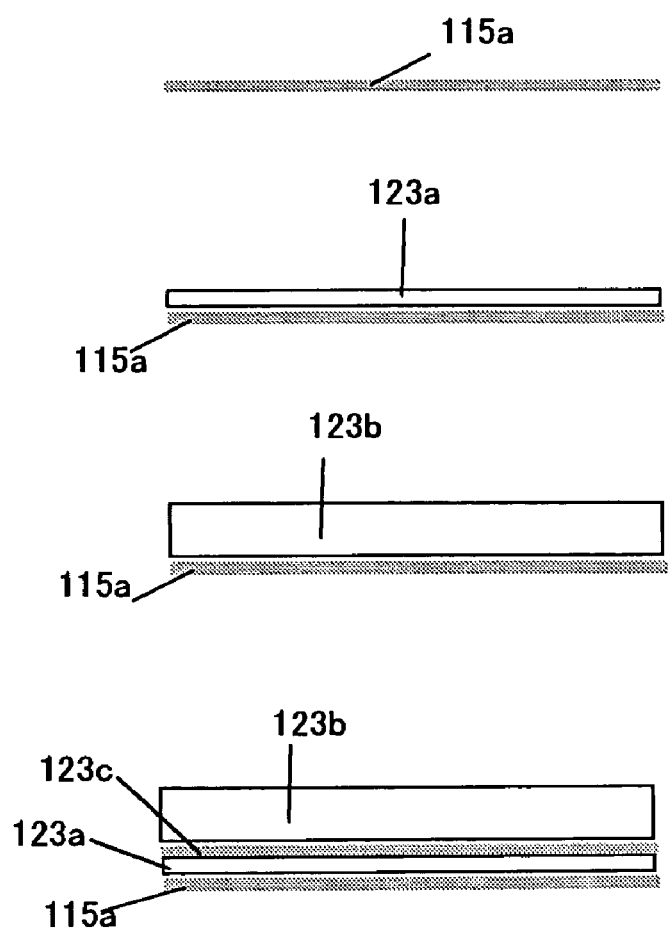
FIG. 40 shows sectional views of formation patterns of an adhesive bond according to an embodiment of the invention.

FIG. 40 shows examples of various patterns of an adhesive bond. Examples include a film of an adhesive bond 115*a*, the adhesive bond 115*a* attached to a supporting film 123*a*, the adhesive bond 115*a* attached to a substrate 123*b* such as glass, quartz, Si, Wafer or plastic, and a film composed of the supporting film 123*a* and the adhesive bond 115*a* attached to the substrate 123*b* by another adhesive bond 123*c*. A GEL-PAK film available from GEL-PAK, LLC is effective for use as the adhesive bond. GEL-PACK has three stages of adhesive strength: ×0, ×4, and ×8, the strength increasing in this order. Use of GEL-PAK ×0 for the adhesive bond 115*aa*, GEL-PAK ×4 for 1151*aa*, and GEL-PAK ×8 for 1150*a*, for example, creates the adhesive hierarchy. The above method may be applied to the eleventh embodiment in the exactly same way. For example, GEL-PAK ×0 may be used for the adhesive bond 115*aa*, GEL-PAK ×4 for 1151*aa*, and GEL-PAK ×8 for 115*a*.

Figure 41:
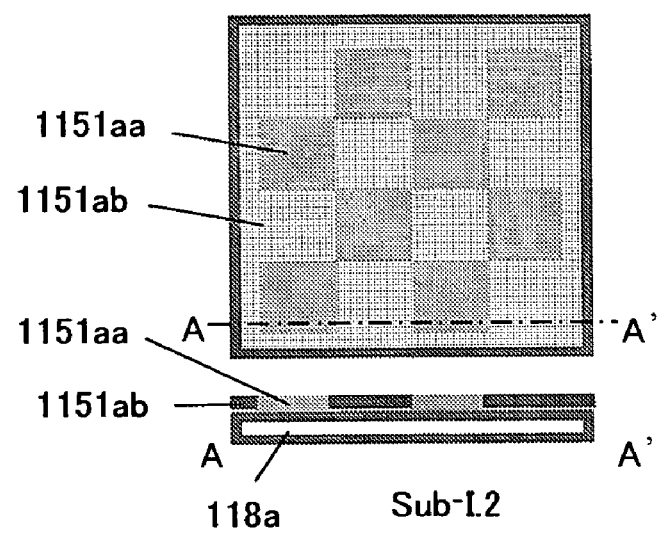
FIG. 41 shows sectional views illustrating an adhesive bond processing according to an embodiment of the invention.
Figure 41:
Figure 41:
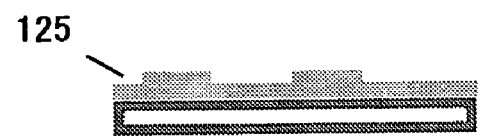

FIG. 41 shows an exemplary method of creating an adhesive pattern on an adhesive bond. A method of reducing the adhesive strength of the adhesive bond 1151*aa* is shown there. The first method is to deposit a thin film on the adhesive bond 1151*aa*. For example, a thin film 124 such as gold, tungsten, chromium, aluminum, and $SiO_2$ is formed on the adhesive bond by etching, lift-off, and so on using a normal photolithography process. The appropriate thickness of the thin film is approximately 10 to 1000 angstrom. The adhesive strength of the area where the thin film is deposited is thereby reduced, crating the adhesive pattern. The second method is to create an irregular pattern on the surface of the adhesive bond 1151aa. For example, a metal mask is created on the adhesive bond using the normal photolithography process, and then etching is performed by reactive ion etching (RIE) and so on. As a result, the adhesive bond is etched away in the area not covered with the metal. The metal mask is then removed, thereby creating an irregular surface 125 on the adhesive bond. There are various other methods of creating the irregular surface, including adhesive bond pressing, hot pressing, injection molding, mold machining, embossing, LIGA processing, stamping, and laser ablation. The above techniques may be used in the exactly same manner in the eleventh embodiment. The above method may be applied to the adhesive bonds 1151ba, 115a, and 1150a.

The above process simplifies and ensures the transfer of micro devices.

Variant Embodiment

AHA-SORT is not restricted to the above process flow. It may be used in part of the micro device disposition process. It is also possible to use some part of the process only. In addition, some steps of the above process may be carried out in a different order.

FIG. 31 shows the concept of AHA-SORT with an example of optical switches, micro lenses, and micro filters. This concept may be applied in the same manner to various other micro devices including tunable filters, waveguides, micro mirrors, micro prisms, vertical waveguides, semiconductor lasers, photo detectors, optical memories, optical amplifiers, photonic crystals, color filters, thin-film transistors, light-emitting devices, ICs, LSIs, capacitors, inductors, resistors, electrostrictive devices, piezoelectric devices, fillers, and biosensors. A simple thin film may be treated as one kind of micro device. It is not necessary that all component micro devices are formed by embedding. Part of the micro devices may be directly formed on a layer.

Figure 42:
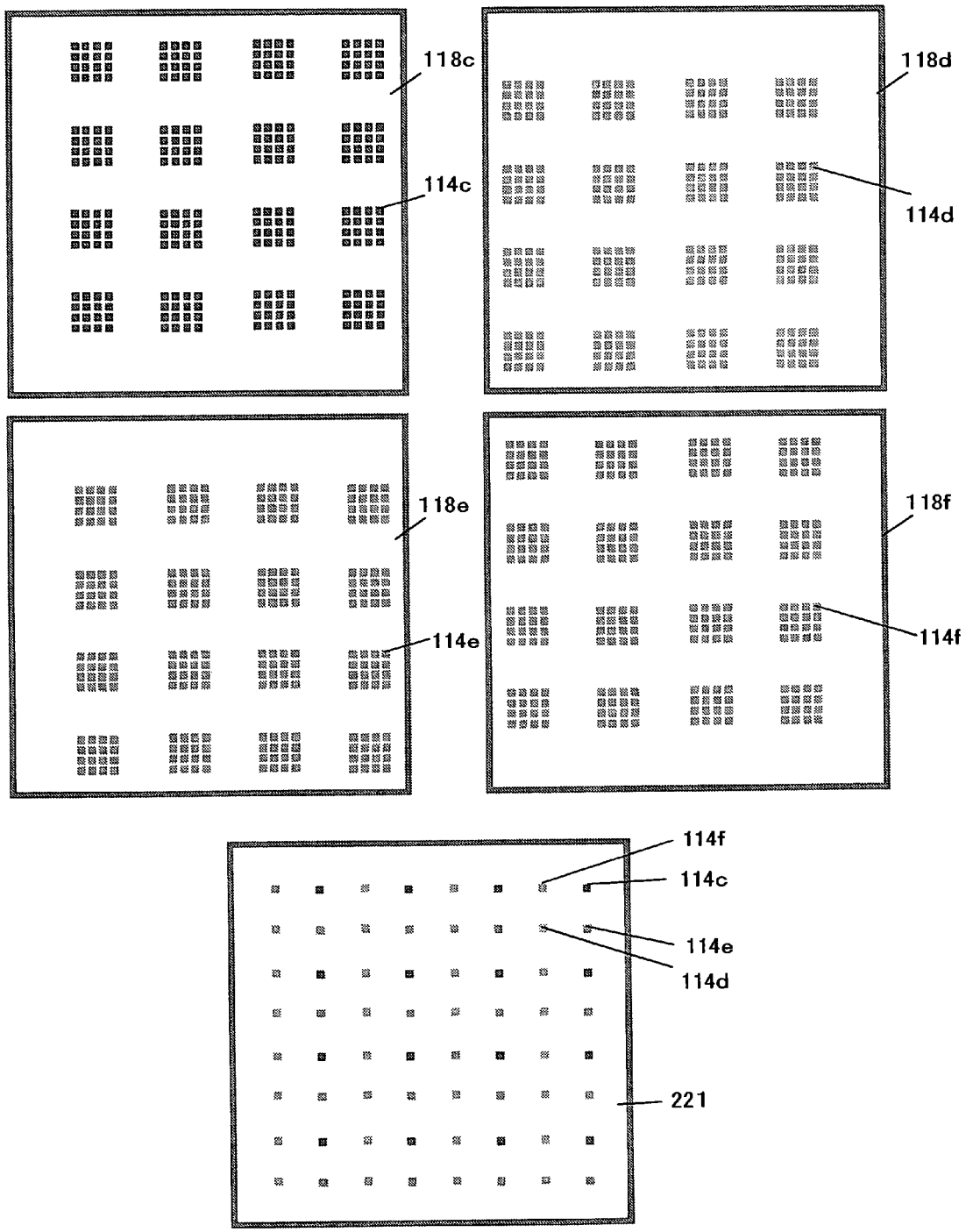
FIG. 42 shows plan views illustrating a micro device disposition process according to a variant of the eleventh and twelfth embodiments of the invention.

It is also possible to use more than two kinds of micro devices. The micro devices are not necessarily arranged regularly. In this case, the adhesive pattern is designed as desired, and a mosaic pattern is adjusted accordingly. The upper four diagrams in FIG. 42 illustrate exemplary arrangement patterns of four kinds of micro devices III (114c), IV (114d), V (114e), and VI (114f) when disposed by AHA-SORT on the supporting substrate Sub-III.2 (118c), the supporting substrate Sub-IV.2 (118d), the supporting substrate Sub-V.2 (118e), and the supporting substrate Sub-VI.2 (118f). The diagram at the bottom of FIG. 42 is an example of the substrate where the above four kinds of micro devices are integrated thereon.

In the case of disposing edge input/output optical switches or modulators, micro lenses, micro filters, tunable filters, waveguides, micro prisms, vertical waveguides, semiconductor lasers, photo detectors, optical memories, optical amplifiers, or photonic crystals, edge reflections may be problematic. In such a case, it is preferred to perform AR coating by a film depositing process with high throwing power such as CVD after the micro device array separating step shown in FIGS. 32a and 32a'.

When transferring the micro devices, alignment is required at both sides. One marker is created when forming the micro devices and another marker when creating the adhesive pattern. They are aligned using a stage with an alignment function in the similar way as a regular mask aligner.

AHA-SORT may be applied to 3D stack architectures including 3D-optoelectronic microsystem, device embedding with S-FOLM, and various other integration system modules. This enhances higher-density and higher-speed 3D optoelectronic Microsystems including OE-LSI, OE-PCB, OE-MCM, smart pixel, 3D stack OE-MCM, and WDM transceiver.

Embodiment 13

The term ELO usually refers to "a process of picking up a micro device with a semiconductor epitaxial film base onto a supporting substrate", which is a standard technique. Here the ELO is more generalized, defined as "a process of picking up a micro device from a fabrication substrate to a supporting substrate".

Figure 43:
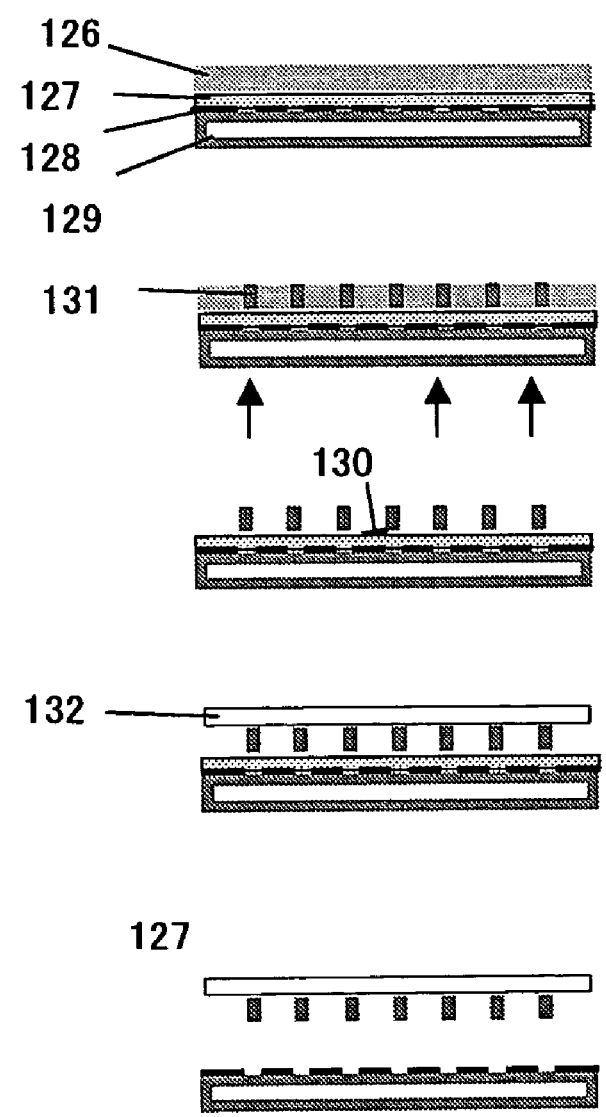
FIG. 43 shows step diagrams (sectional views) illustrating a micro device disposition process according to the thirteenth embodiment of the invention.
Figure 44:
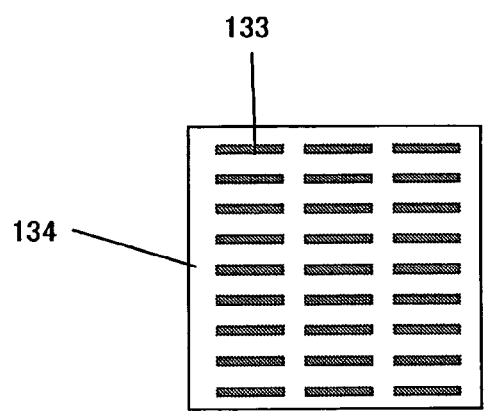
FIG. 44 is a plan view showing an embedded structure of fillers according to the fourteenth embodiment of the invention.

FIG. 43 shows a variant of ELO. On a light-transmitting substrate 129, a light-shielding thin film 128 is selectively formed by a normal photolithography process. A peel-off layer 127 is formed thereon, and a photosensitive material layer 126 is further formed thereon. Next, light 130 having the wavelength which the photosensitive material can sense is applied to the light-transmission substrate 129, thereby changing the property of the photosensitive material. If the photosensitive material is a photopolymer resin, for example, the part exposed to the light is hardened. Then, the non-hardened part is removed by a development process, and a supporting substrate 132 is brought into contact with the surface. Finally, the peel-off layer 127 is removed, and the micro devices are picked up onto the supporting substrate 132. The substrate with the light-shielding film may be reused. Thus, once the photolithography process is performed, micro device fabrication and pickup can be achieved with a simple process, allowing cost reduction.

The light-transmitting substrate 129 may be quartz or glass, for example. The light-shielding thin film 128 may be a metal such as gold, tungsten, chromium, or aluminum. As the peel-off layer 27, polyvinil alchol (PVA), for example, may be used. A typical of the photosensitive material 126 is an epoxy or polyimide photopolymer resin. A monomer or low-molecular weight polymer of such a resin is used as a film. The development process may use various solvents including alcohol and acetone with dissolved monomer or low-molecular weight polymer. When using PVA as the peel-off layer, PVA is dissolved in water or alcohol and ELO is performed. The appropriate thickness of PVA depends on how fine a device to create is. A typical thickness is approximately 1 µm to 30 µm. It would be obvious that various materials, not limited to PVA, may be used as the peel-off layer.

Embodiment 14

FIG. 17 shows an example of alignment fillers created by the AHA-SORT process. A filter 133 may be made of various materials such as $SiO_2$, alumina, a thin piece of semiconductor, and a piece of metal. The interval and arrangement pattern of the fillers may be easily controlled by the processes described in the eleventh and twelfth embodiments. Use of a single kind of filler can omit one stage of the transfer process to the supporting substrate or the transfer to the integration supporting substrate. Since the positions of the alignment fillers can be designed, there is an advantage that the mechanical and thermal properties of a film 119 are controllable without interfering with the embedding of the micro devices.

Embodiment 15

Figure 45:
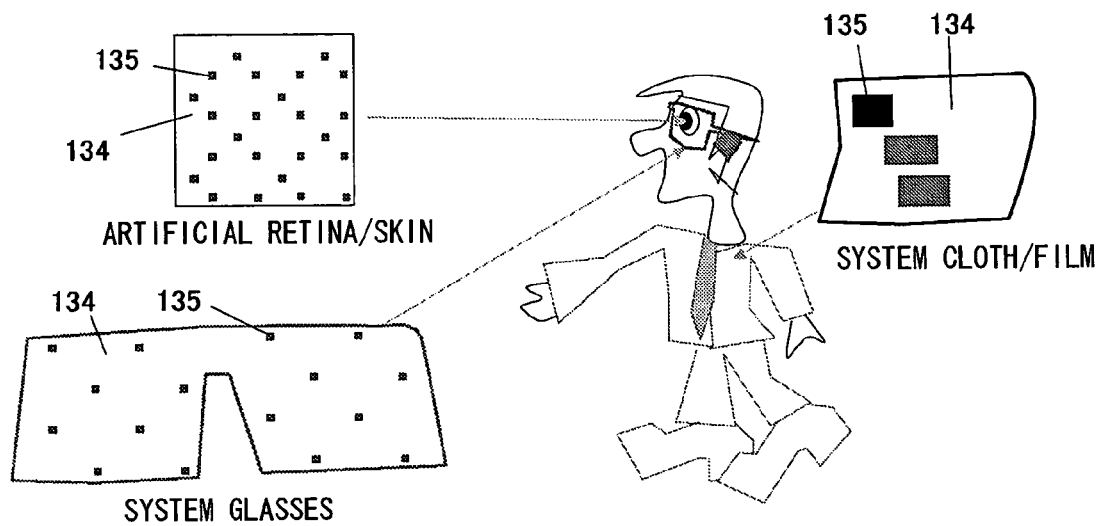
FIG. 45 shows plan views and a three-dimensional view illustrating an architecture of Wearable Integrated System for Ecology (WISE) according to the fifteenth embodiment of the invention.

FIG. 45 shows examples of various wearable systems (Wearable Integrated System for Ecology: WISE). Embedding a micro device 135 such as a photo detector or various kinds of biosensors into a polymer film 134 produces an artificial retina or a functional artificial skin. Outputs from the micro device are input to the nervous system or output to the outside. Embedding the micro device 135 such as a photo detector or a light-emitting device into a polymer or a glass film produces a pair of glasses with a camera or display function. If one pixel of a photo detector or a light-emitting device is 20 μm square and a pixel pitch is 100 μm, a two-dimensional array of photo detectors or light-emitting devices occupies only one-twenty fifth of the area. Thus, with the use of transparent electrodes, light detection or display can be performed without reducing the transmission of the film. Further, by the combination with an appropriate thin-film lens, glasses with a camera can be achieved. A speaker may be integrated to the glasses by using a thin-film piezoelectric device. Furthermore, embedding a micro device into a polymer film, cloth, thread, or ribbon produces a system film, cloth, thread, ribbon, and so on, creating wearable systems. The micro devices to be embedded include an optical device such as a photo detector or a light-emitting device, or other devices able to have a thin-film shape such as LSI, IC, electrostrictive device (speaker), piezoelectric device (micro phone), and piezoelectric keyboard. PC, telephone, camera, display and battery may be thereby created. AHA-SORT is extremely efficient as a production technology thereof.

Figure 46:
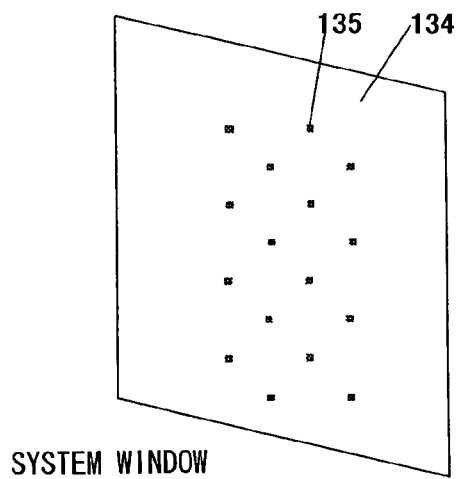
FIG. 46 is a plan view illustrating the structure of a functional film/glass according to the fifteenth embodiment of the invention.

FIG. 46 shows a case where the above is applied to a window or a normal film.

Embodiment 16

Figure 47:
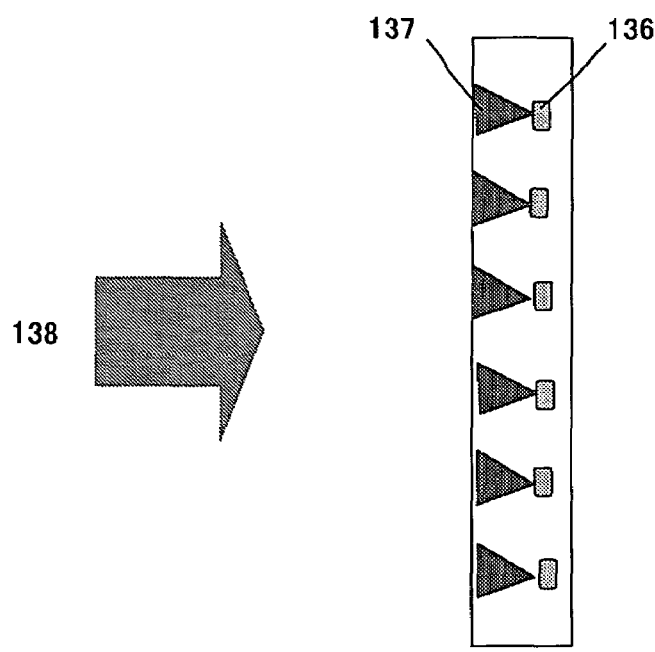
FIG. 47 is a sectional view showing the structure of a concentrating solar system according to the sixteenth embodiment of the invention.

FIG. 47 shows a sectional view of a concentrating solar cell created using AHA-SORT. Solar cell micro devices 136 composed of Si or III-V compound are arranged in a two-dimensional array, and outside light 138 is concentrated by a concentrator 137. AHA-SORT allows reducing consumption of semiconductor material, achieving a low-cost solar cell module. The concentrator 137 may be a regular micro lens sheet, Fresnel lens sheet, or Self-Organizing Waveguide SOLNET. Further, if the solar cell is integrated with a film polymer battery by way of lamination and so on, it produces a solar cell with a capacitor effect. Since the module itself may be shaped like a film, it can be regarded as one kind of the above WISE, which is wearable.

Embodiment 17

Figure 48:
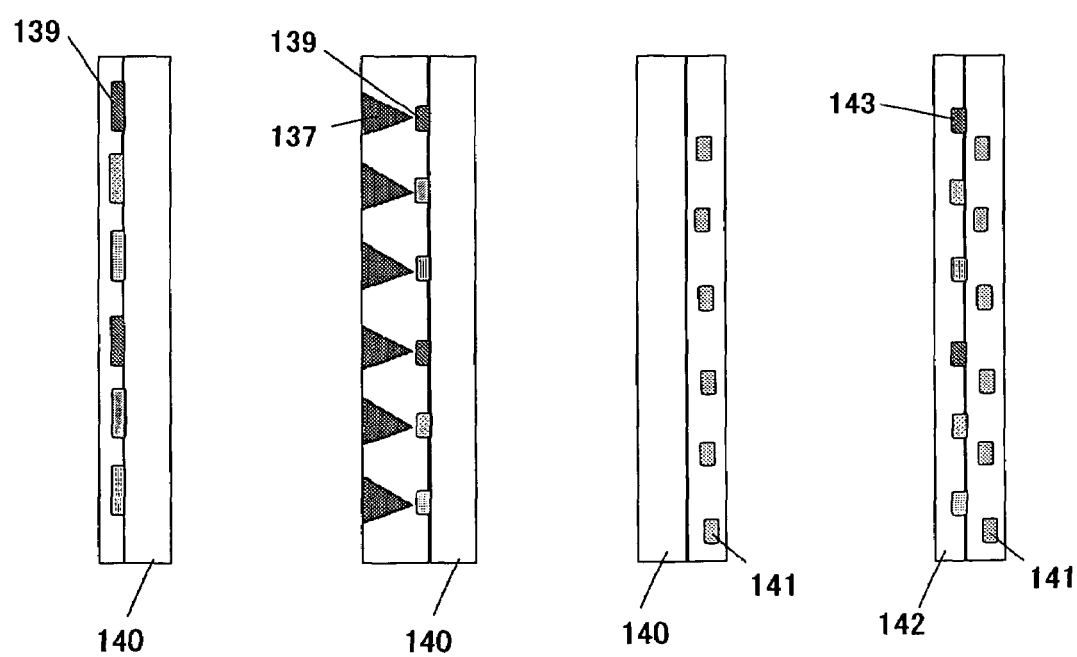
FIG. 48 is a sectional view showing the structure of displays according to the seventeenth embodiment of the invention.

FIG. 48 shows sectional views of displays produced by using AHA-SORT. When producing a liquid crystal panel 140, AHA-SORT is used to create a two-dimensional array of wavelength filters 139. Concentrating backlight with the condenser 137 allows reducing the area of the wavelength filter 139, thus saving filter material while enhancing panel brightness. The concentrator 137 may be a regular micro lens array, Fresnel lens array, or Self-Organizing Waveguide SOLNET. AHA-SORT may be used for creating a micro lens array or a Fresnel lens array. The AHA-SORT process is also applicable for the transfer of thin-film transistors (TFTs) 141 for liquid crystal driving. It is particularly effective when using high electron mobility transistors. The process can transfer high performance polysilicon transistors, silicon transistors, or compound semiconductor transistors separately created on a semiconductor wafer to a panel. In this process, by high-density production of the transistors on a wafer, transistors can be supplied from one wafer to multiple panels, saving material and process costs.

In the case of producing a LED panel 142, AHA-SORT is used in creating a two-dimensional array of thin-film LEDs 143. The LEDs may be either inorganic or organic. AHA-SORT may be also used when TFT 141 is required.

As in the foregoing, the invention described in the eighth to seventeenth embodiments facilitates the creation of a high-density bonding interface between a drive IC and an optical device. Further, it can provide a high-density, low-cost, and high-speed 3D optoelectronic microsystem using the same.

Furthermore, it can provide an all optical 3D optoelectronic microsystem which uses light to control light, and a wavelength conversion system based on the same.

In addition, it can improve the wavelength resolution of a micro filter of a 3D optoelectronic microsystem.

The invention also provides a low-cost, resource-saving, and reliable micro device transfer process which uses a series of adhesive bonds with adhesive hierarchy, allows reuse of the adhesive bonds, and is implementable with a simple process. It enables cost reduction, resource saving, and high-density integration of various features including an optical switch, a wavelength switch, an optical transmitter, an optical receiver, an optical memory, and an optical amplifier. Besides, it enhances higher-density and higher-speed 3D optoelectronic Microsystems including OE-LSI, OE-PCB (printed circuit board), OE-MCM, smart pixel, 3D stack OE-MCM, and WDM transceiver.

In addition, the invention has a ripple effect that allows control of the mechanical and thermal properties of a film without interfering with the embedding of micro devices.

Furthermore, it achieves a broad range of wearable systems including a system film, cloth, thread, and ribbon such as PC, telephone, camera, display, battery, and keyboard, and an artificial retina and an artificial skin integrated with various sensors.

It also provides a low-cost solar cell module with reduced consumption of semiconductor material.

Besides, it achieves high-performance, low-cost display capable of saving filter material and semiconductor material.

INDUSTRIAL APPLICABILITY

As explained in the foregoing, the present invention may be applied to a large-scale optical switching system for high-speed, high-capacity communication networks. It is also applicable to an optical switching system and an optical wiring network system for high-speed and reconfigurable computers. Further, it provides a broad range of wearable systems including a system film, cloth, thread, and ribbon such as PC, telephone, camera, display, battery, and keyboard, and an artificial retina and an artificial skin integrated with various sensors.

It provides a low-cost solar cell module with reduced consumption of semiconductor material.

It also achieves high-performance, low-cost display capable of saving filter material and semiconductor material.

The invention claimed is:

1. A process of transferring thin-film devices, comprising:
    a step of forming an adhesive bond whose adhesive strength changes by light exposure on a supporting substrate;
    a step of selectively exposing the adhesive bond to reduce the adhesive strength of part of the adhesive bond;
    a step of transferring a thin-film device array onto the selectively-exposed adhesive bond in accordance with an exposure pattern;
    a step of exposing an area where the thin-film device array is transferred, wherein the exposing is done through a backside of the supporting substrate; and a step of contacting a substantial substrate with the thin-film device array formed on the adhesive bond exposed from the backside of the supporting substrate to transfer part or all of thin-film devices in the thin-film device array onto the substantial substrate.

2. A process of transferring thin-film devices, comprising:
a first step of selectively exposing an adhesive bond which is formed on a supporting substrate and whose adhesive strength changes by light exposure;
a second step of contacting the selectively-exposed adhesive bond with a thin-film device array on a first substrate;
a third step of selectively transferring part of thin-film devices in the thin-film device array from the first substrate onto the selectively-exposed adhesive bond in accordance with an exposure pattern;
a fourth step of exposing the adhesive bond from a backside of the supporting substrate to reduce the adhesive strength of the selectively-exposed adhesive bond; and
a fifth step of contacting a substantial substrate with the thin-film device array formed on the adhesive bond exposed from the backside of the supporting substrate to transfer part or all of the thin-film devices in the thin-film device array onto the substantial substrate.

3. A process of transferring thin-film devices according to claim 2, comprising, after the fourth step, a step of reexposing the adhesive bond.

4. A process of transferring thin-film devices, comprising:
a first step of selectively exposing an adhesive bond which is formed on a supporting substrate and whose adhesive strength changes by light exposure;
a second step of contacting the selectively-exposed adhesive bond with a first thin-film device array on a first substrate;
a third step of selectively transferring at least a part of thin-film devices in the first thin-film device array from the first substrate onto the selectively-exposed adhesive bond in accordance with an exposure pattern;
a fourth step of contacting the selectively-exposed adhesive bond with a second thin-film device array on a second substrate to selectively transfer at least a part of thin-film devices on the second substrate onto the adhesive bond in accordance with the exposure pattern;
a fifth step of exposing the adhesive bond from a backside of the supporting substrate to reduce the adhesive strength of the selectively-exposed adhesive bond; and a sixth step of transferring the thin-film devices which have been transferred to the supporting substrate onto a substantial substrate.

5. A process of transferring thin-film devices, comprising:
a first step of selectively exposing an adhesive bond whose adhesive strength changes by light exposure;
a second step of contacting the selectively-exposed adhesive bond with a first thin-film device array on a first substrate to selectively transfer part of thin-film devices in the first thin-film device array from the first substrate onto the selectively-exposed adhesive bond in accordance with an exposure pattern;
a third step of contacting the selectively-exposed adhesive bond with a second thin-film device array on a second substrate to selectively transfer part of thin-film devices in the second thin-film device array from the second substrate onto the selectively-exposed adhesive bond in accordance with an exposure pattern; and
a fourth step of reexposing the adhesive bond from a backside of the supporting substrate and transferring the first and the second thin-film devices to another substrate.

6. A process of transferring micro devices, comprising:
a first step of selectively depositing a thin film on an adhesive bond to create an adhesive pattern having at least a higher adhesive strength area and a lower adhesive strength area;
a second step of contacting the adhesive bond where the thin film is selectively deposited with a micro device array on a first supporting substrate; and
a third step of selectively transferring part of micro devices in the micro device array from the first supporting substrate onto the higher adhesive strength area in accordance with the adhesive pattern.

7. A process of transferring micro devices, comprising:
a first step of selectively creating an irregular surface on an adhesive bond to create an adhesive pattern having at least a higher adhesive strength area and a lower adhesive strength area;
a second step of contacting the adhesive bond where the irregular surface is created with a micro device array on a first supporting substrate; and
a third step of selectively transferring part of micro devices in the micro device array from the first supporting substrate onto the higher adhesive strength area in accordance with the adhesive pattern.

\* \* \* \* \*